(12) United States Patent
Lim et al.

(10) Patent No.: US 11,271,069 B2
(45) Date of Patent: Mar. 8, 2022

(54) DISPLAY DEVICE HAVING AN ALIGN MARK TO FACILITATE ASSEMBLY OF LAYERS DURING MANUFACTURE

(71) Applicant: Samsung Display Co., LTD., Yongin-si (KR)

(72) Inventors: Sang Hoon Lim, Yongin-si (KR); Young Kwan Kim, Yongin-si (KR); Bo Hyuk Lee, Yongin-si (KR); Jin Hyeong Kim, Yongin-si (KR); Young Jin Oh, Yongin-si (KR); Ku Hyun Kang, Yongin-si (KR); Sung Jin Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/866,915

(22) Filed: May 5, 2020

(65) Prior Publication Data

US 2020/0365676 A1    Nov. 19, 2020

(30) Foreign Application Priority Data

May 14, 2019    (KR) .......................... 10-2019-0056485

(51) Int. Cl.
| | | |
|---|---|---|
| *G06F 3/041* | (2006.01) | |
| *H01L 27/32* | (2006.01) | |
| *H01L 51/52* | (2006.01) | |
| *G06F 3/047* | (2006.01) | |

(52) U.S. Cl.
CPC .......... *H01L 27/3276* (2013.01); *G06F 3/047* (2013.01); *G06F 3/0412* (2013.01); *H01L 27/323* (2013.01); *H01L 51/5237* (2013.01)

(58) Field of Classification Search
CPC ... H01L 27/3276; H01L 27/32; H01L 27/323; H01L 51/5237; G06F 3/0412; G06F 3/047; G06F 3/041
See application file for complete search history.

(56) References Cited

U.S. PATENT DOCUMENTS

| | | | |
|---|---|---|---|
| 9,600,111 | B2 | 3/2017 | Hong et al. |
| 9,632,364 | B2 | 4/2017 | Han |
| | | (Continued) | |

FOREIGN PATENT DOCUMENTS

| | | |
|---|---|---|
| KR | 10-0658292 | 12/2006 |
| KR | 10-0786039 | 12/2007 |
| | (Continued) | |

*Primary Examiner* — Pegeman Karimi
(74) *Attorney, Agent, or Firm* — H.C. Park & Associates, PLC

(57) ABSTRACT

A display device includes: a base substrate including a display area and a non-display area positioned at a side of the display area; at least one transistor in the display area of the base substrate and conductive lines in the non-display area of the base substrate; at least one light-emitting element in the display area that is coupled to the at least one transistor; an encapsulation layer covering the light-emitting element; a sensing electrode on the encapsulation layer and a sensing line on the encapsulation layer coupled to the sensing electrode; and an align mark on the encapsulation layer at least partially overlapping some of the conductive lines in the non-display area, in a plan view.

23 Claims, 22 Drawing Sheets

(56) References Cited

U.S. PATENT DOCUMENTS

| | | | |
|---|---|---|---|
| 2010/0245271 A1* | 9/2010 | Park | H01L 51/524 |
| | | | 345/173 |
| 2015/0103500 A1* | 4/2015 | Bae | H01L 24/06 |
| | | | 361/749 |
| 2015/0263309 A1* | 9/2015 | Hong | H01L 27/323 |
| | | | 257/40 |
| 2016/0334674 A1* | 11/2016 | Yu | G03F 9/7084 |
| 2018/0166525 A1* | 6/2018 | Kim | H01L 51/5253 |
| 2018/0269427 A1* | 9/2018 | Park | H01L 27/3276 |
| 2018/0329552 A1* | 11/2018 | Song | H01L 27/3276 |
| 2019/0131572 A1* | 5/2019 | Gwon | G06F 3/044 |

FOREIGN PATENT DOCUMENTS

| | | |
|---|---|---|
| KR | 10-2014-0123778 | 10/2014 |
| KR | 2015-0108479 | 9/2015 |

* cited by examiner

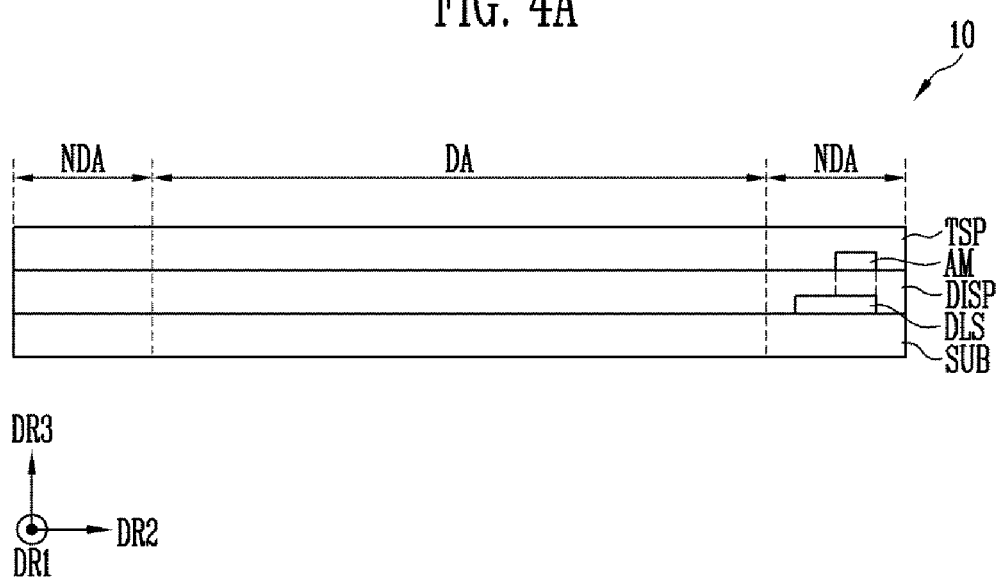
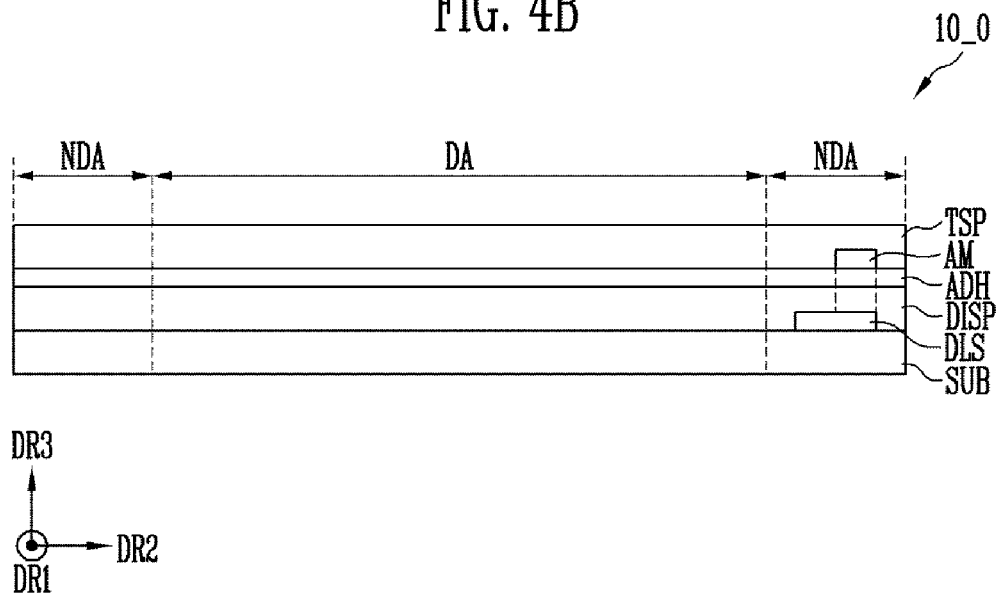

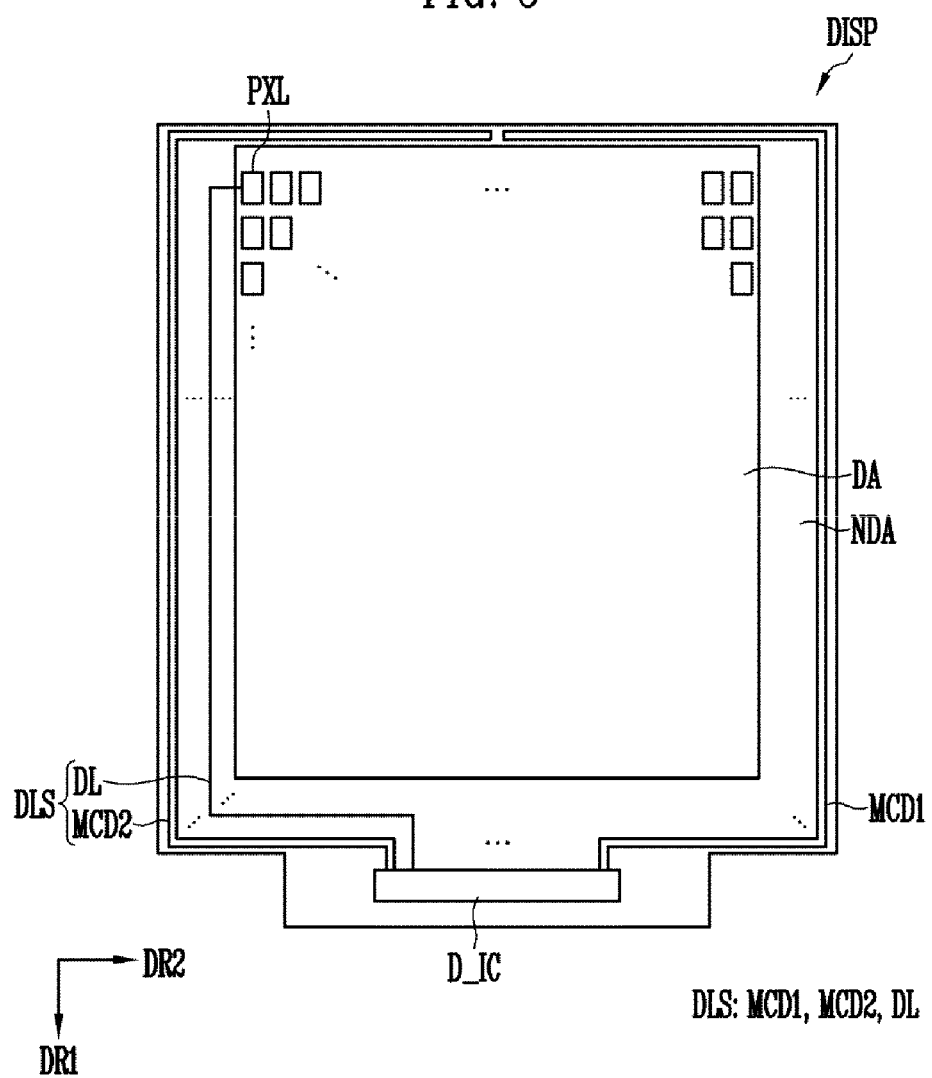

DISPLAY DEVICE HAVING AN ALIGN MARK TO FACILITATE ASSEMBLY OF LAYERS DURING MANUFACTURE

CROSS REFERENCE TO RELATED APPLICATION

This application claims priority from and the benefit of Korean Patent Application No. 10-2019-0056485 filed on May 14, 2019, which is hereby incorporated by reference for all purposes as if fully set forth herein.

BACKGROUND

Field

The invention relates generally to a display device and, more particularly, to a display device having align marks to facilitate assembly of the layers of the device during manufacture.

Discussion of the Background

A display device may include a display panel on which an image is displayed and a window which is disposed on the display panel to protect the display panel.

In order to recognize the location of the display panel in a process for bonding the window to the display panel, the display panel includes an align mark for location recognition.

Such an align mark is provided in a non-display area (i.e., an area in which an image is not displayed) of the display panel, and a dead space may occur in the non-display area due to the design constraints of the align mark.

Recently, demand for reducing the size of the bezel corresponding to the non-display area and maximizing the available space for the display area of the display panel has increased. Therefore, much research has been conducted into various schemes for minimizing the dead space due to the align mark.

The above information disclosed in this Background section is only for understanding of the background of the inventive concepts, and, therefore, it may contain information that does not constitute prior art.

SUMMARY

Applicant realized that the amount of dead space in the non-display area of display device can be maximized by adjusting the pitch of the signal lines relative to the align marks.

Electronic and display devices constructed according to the principles and exemplary embodiments of the invention have a reduced dead space in the bezel area surrounding the display area. The reduced dead space may be accomplished by positioning align marks to overlap at least some of the outermost lines or be disposed adjacent to the outermost lines. The outermost lines may have a reduced density (pitch) to permit a greater transmittance of light.

Additional features of the inventive concepts will be set forth in the description which follows, and in part will be apparent from the description, or may be learned by practice of the inventive concepts.

According to one aspect of the invention, a display device includes: a base substrate including a display area and a non-display area positioned at a side of the display area; at least one transistor in the display area of the base substrate and conductive lines in the non-display area of the base substrate; at least one light-emitting element in the display area that is coupled to the at least one transistor; an encapsulation layer covering the light-emitting element; a sensing electrode on the encapsulation layer and a sensing line on the encapsulation layer coupled to the sensing electrode; and an align mark on the encapsulation layer at least partially overlapping some of the conductive lines in the non-display area, in a plan view.

Some of the conductive lines may be provided on a first area of the base substrate, and the remaining ones of the conductive lines may be provided on a second area of the base substrate, and a transmittance at the first area may be higher a transmittance at the second area.

A pitch between the some of the conductive lines may be greater than the pitch between the remaining conductive lines.

A shortest distance from one of the conductive lines to an edge of the base substrate may be less than a shortest distance from the align mark to the edge of base substrate, in a plan view.

The align mark can have align patterns, and the align patterns may be spaced apart from each other, and adjacent align patterns may have different planar shapes.

The align patterns may be sequentially arranged along a first direction, a length of each of the align patterns in the first direction may be greater than a width of each of the align patterns in a second direction, the second direction may be generally perpendicular to the first direction, and a pitch between the align patterns may be less than the length in the first direction.

The length in the first direction may be within a range from about 100 μm to about 500 μm, and the width in the second direction may be within a range from about 30 μm to about 150 μm.

The length in the first direction may be about three to six times as large as the width in the second direction.

One of the align patterns may have a generally rectangular planar shape, and another of the align patterns may have a generally triangular planar shape.

The align mark may include a first align pattern, a second align pattern, and a third align pattern that are sequentially arranged, and the first align pattern and the third align pattern may have a substantially identical planar shape.

The some of the conductive lines may include a crack detection line extending along an edge of the display area, and the crack detection line may be electrically isolated from the at least one transistor.

A side surface of the display device may form an acute angle with a line generally parallel to the thickness of the base substrate.

The at least one transistor may comprise: a semiconductor pattern disposed on the base substrate; a gate electrode on the semiconductor layer overlapping the semiconductor pattern; a first insulating layer disposed on the gate electrode; and a source electrode and a drain electrode on the first insulating layer.

The some of the conductive lines may be disposed on a same layer as the gate electrode.

The some of the conductive lines may be disposed on a same layer as the source electrode and the drain electrode.

The align mark can have sub-align marks, and the sub-align marks may be separated from each other and disposed in different layers.

The align mark may partially overlap the some of the conductive lines, and the align mark may be closer to an edge of the base substrate than the conductive lines.

According to another aspect of the invention, a display device, includes: a base substrate including a display area and a non-display area positioned at a side of the display area; at least one transistor on the display area of the base substrate and conductive lines disposed on the non-display area of the base substrate; at least one light-emitting element in the display area that is coupled to the at least one transistor; an encapsulation layer covering the light-emitting element; a sensing electrode on the encapsulation layer and a sensing line on the encapsulation layer coupled to the sensing electrode; and an align mark on the encapsulation layer disposed adjacent to the conductive lines by a distance less than a pitch by which the conductive lines are spaced apart from each other.

According to a further aspect of the invention, an electronic device, includes: a base substrate including a display area and a non-display area; a semiconductor pattern disposed on the base substrate in the display area; first conductive patterns disposed on the semiconductor pattern; a first insulating layer disposed on the first conductive patterns; and second conductive patterns disposed on the first insulating layer, wherein the first conductive patterns or the second conductive patterns include an align mark, and wherein the align mark at least partially overlaps at least one conductive pattern among the first conductive patterns and the second conductive patterns. The align mark may be included in the first conductive patterns, and the align mark may overlap at least one of the second conductive patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 4A and 4B are cross-sectional views illustrating exemplary embodiments of the display module of FIG. 3.

FIG. 5 is a plan view illustrating an exemplary embodiment of a display unit included in the display module of FIG. 4A.

DETAILED DESCRIPTION

Figure 1:
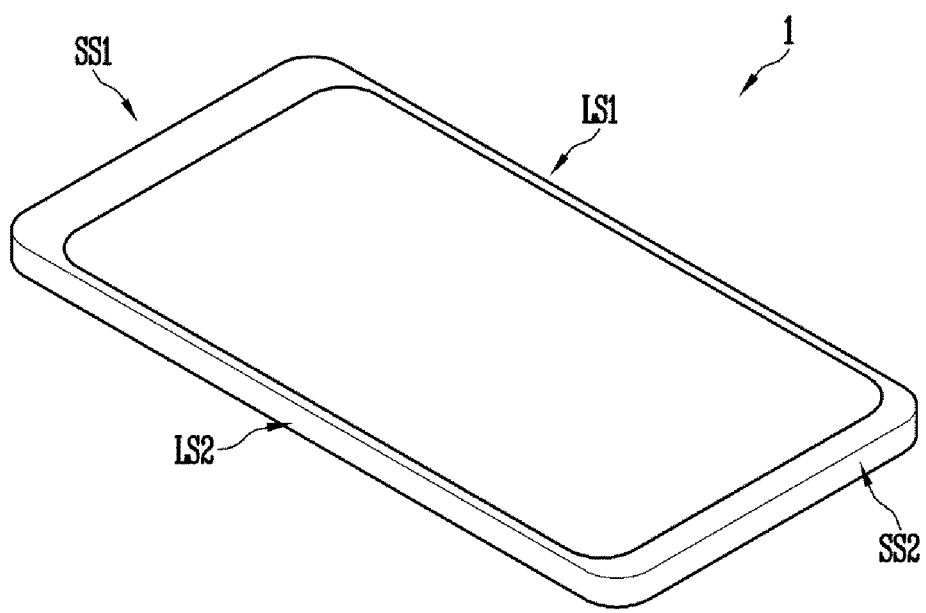
FIG. 1 is a perspective view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As used herein, the terms "display device" and "electronic device" may be used interchangeably, may represent different versions of the exemplary embodiments disclosed herein, and may have layers defined by different ordinal numbers.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating an exemplary embodiment of a display device constructed according to principles of the invention.

Referring to FIG. 1, a display device 1 may display an image. The display device 1 may be a portable terminal, such as a tablet PC, a smart phone, a personal digital assistant (PDA), a portable multimedia player (PMP), a game console, or a wristwatch-style electronic device. However, the type of the display device 1 is not limited thereto. For example, the display device 1 may be large-sized electronic equipment, such as a television or an outdoor billboard, or small and medium-sized electronic equipment, such as a personal computer, a notebook computer, a vehicle navigation device or a camera.

The display device 1 may have a generally planar rectangular shape. The display device 1 may include two long sides (e.g., a first long side LS1 and a second long side LS2) and two short sides (e.g., a first short side SS1 and a second short side SS2). Corners at which the long sides LS1 and LS2 of the display device 1 meet the short sides SS1 and SS2 may be maintained at a right angle, but may also form a curved surface, as illustrated in FIG. 1. The generally planar shape of the display device 1 is not limited to the exemplified shape, but may be a generally circular shape or any other shape.

Figure 2:
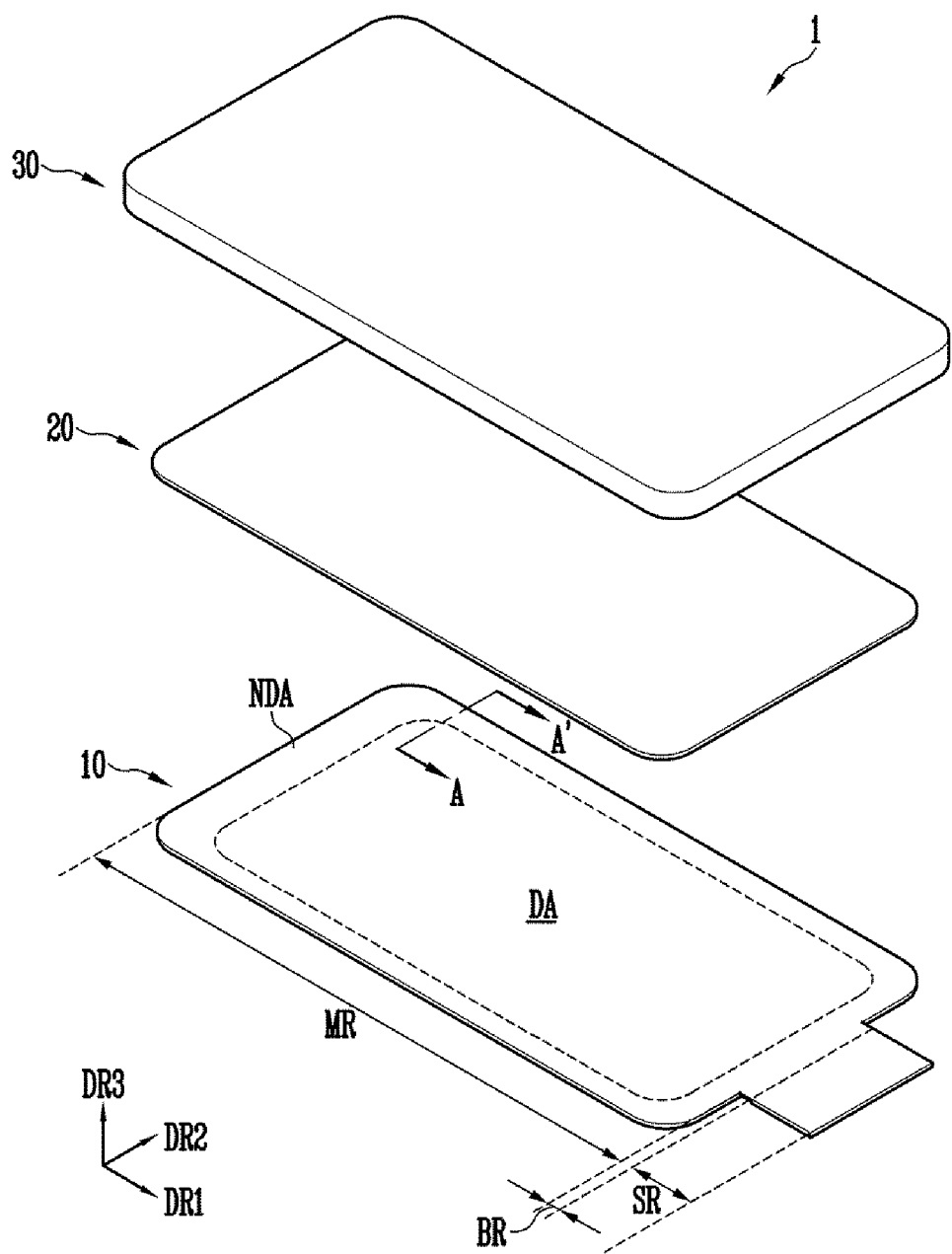
FIG. 2 is an exploded perspective view illustrating an exemplary embodiment of the display device of FIG. 1.

FIG. 2 is an exploded perspective view illustrating an exemplary embodiment of the display device of FIG. 1.

Referring to FIG. 2, a display device 1 may include a display module 10, a function module 20, and a window (or a window module) 30.

The display module 10 may display an image. For example, the display module 10 may be an organic light-emitting display panel. Hereinafter, a case where the display module 10 is an organic light-emitting display panel is exemplified, but the display module of the exemplary embodiments are not limited thereto. For example, the display module 10 may be another type of display panel, such as a liquid crystal display panel, an electrophoretic display panel or a plasma display panel.

Also, the display module 10 may sense a touch input. A detailed configuration of the display module 10 will be described later with reference to FIG. 3.

The display module 10 may include a display area DA and a non-display area NDA. The display area DA may be defined as a portion in which an image is displayed and the non-display area NDA may be defined as a portion in which an image is not displayed.

The display area DA may be disposed in (or positioned at) a central portion of the display module 10, and may be larger than the non-display area NDA. In the display area DA, a plurality of pixels PXL (see FIG. 5), which will be described later, may be arranged. The display area DA may have a generally rectangular shape or a rectangular shape with rounded corners. However, the shape of the display area DA is not limited thereto, and the display area DA may have various shapes, such as a generally square shape, a generally polygon shape, a generally circle shape or a generally ellipse shape. Also, the display area DA may include a plurality of sub-display areas that are spaced apart from each other.

The non-display area NDA may be disposed on at least one side of the display area DA or around the display area DA. The non-display area NDA may be an area extending from the outer edge of the display area DA to the boundary (or edge) of the display module 10. Signal lines or driving circuits for applying signals to the display area DA (or pixels arranged in the display area DA) may be disposed in the non-display area NDA. Further, an outermost black matrix may be disposed in the non-display area NDA.

Further, the display module 10 may include a main region MR, a bending region BR, and a sub-region SR. The main region MR may include the display area DA, and may form the display surface of the display device 1. The bending region BR may extend from the main region MR in a first direction DR1 and be bendable. The sub-region SR may extend from the bending region BR, and may overlap the main region MR depending on the bending state of the bending region BR.

A detailed configuration of the display module 10 will be described later with reference to FIG. 11 based on a cross-sectional view taken along line A-A' of FIG. 2.

Unless a special definition is made, the term "upper", "top", or "top surface" herein means the display surface on which an image is displayed based on the display module 10, and the term "lower" "bottom" or "bottom surface" may mean a side opposite the display surface based on the display module 10.

The function module 20 may be disposed on the top of the display module 10. The function module 20 may include at least one function layer. The function layer may be a layer on which a color filtering function, a color conversion function, a polarization function, etc. are performed. The function layer may be implemented as a sheet layer formed of a sheet, a film layer formed of a film, a thin-film layer, a coating layer, a panel or a plate. A single function layer may be configured using a single layer, or may be configured using a plurality of stacked thin films or coating layers. For example, the function layer may be a color filter, an optical film, or the like. The function module 20 may be omitted.

The window 30 may be disposed on the top of the function module 20 (or the display module 10). The window 30 may overlap the display module 10 and cover substantially the entire surface of the display module 10. The window 30 may be larger than the display module 10. For example, on both short sides of the display device 1, the window 30 may protrude outwardly from the display module 10. Even on both long sides LS1 and LS2 of the display device 1, the window 30 may protrude from the display module 10. The window 30 may protrude from both long sides LS1 and LS2 of the display device 1, and may further protrude from both short sides SS1 and SS2 of the display module 10.

The window 30 may include a central portion and a shielding pattern. The central portion may overlap the display area DA of the display module 10 to transmit light emitted from the display area DA. The shielding pattern may be located on the border of the window 30. The shielding pattern may overlap the non-display area NDA of the display module 10, and may prevent the non-display area NDA from being perceived.

The function module 20 and the window 30 may be coupled to the display module 10 through an optically clear adhesive (OCA) or an optically clear resin (OCR).

Figure 3:
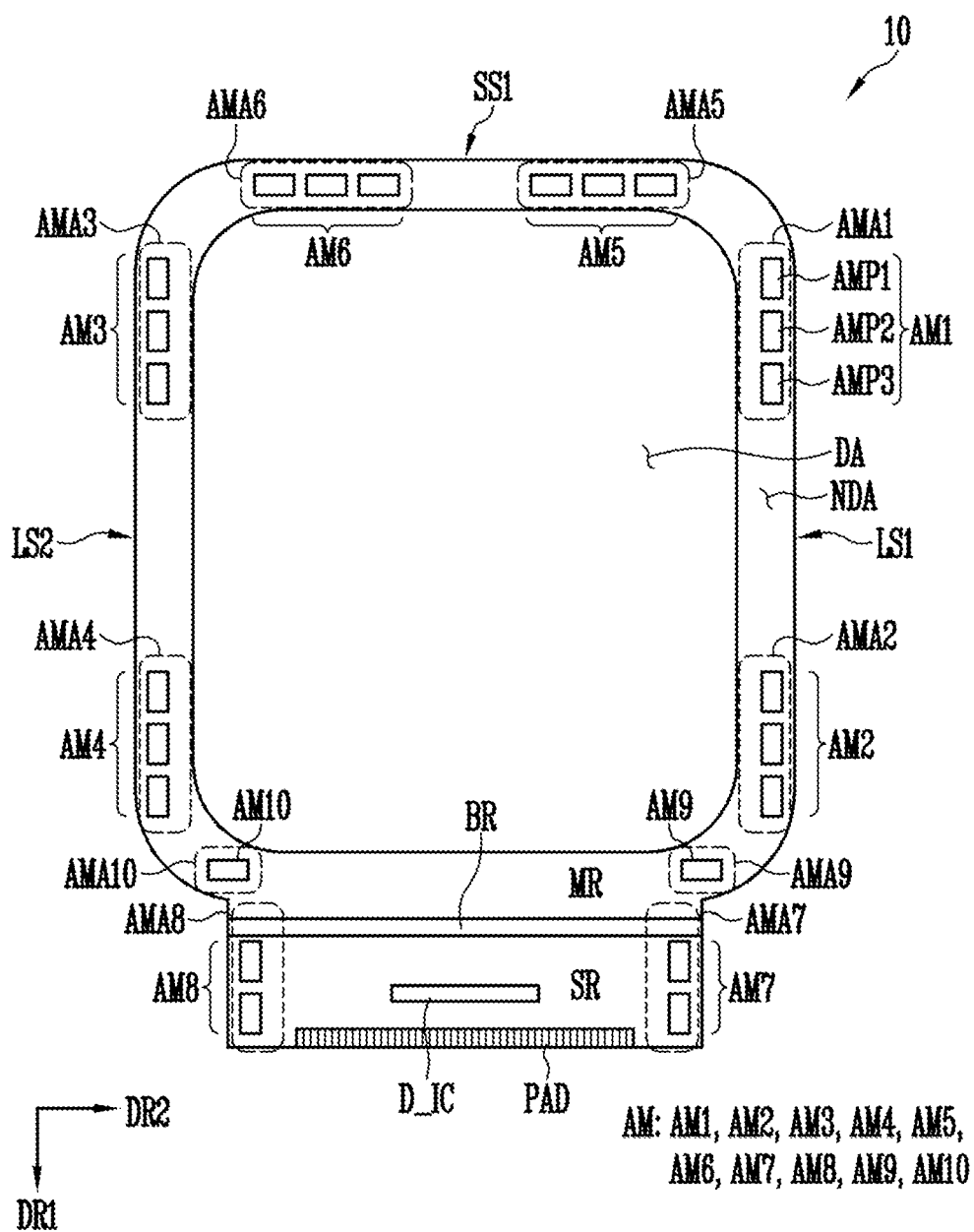
FIG. 3 is a plan view illustrating an exemplary embodiment of a display module included in the display device of FIG. 2.

FIG. 3 is a plan view illustrating an exemplary embodiment of the display module included in the display device of FIG. 2.

Referring to FIG. 3, the display module 10 may include one or more align marks AM (or an alignment mark, an align key).

The align mark AM may be used as an identification mark for alignment during a process for attaching the window 30 (or the function module 20, OCA, or OCR) to the display module 10. Further, the align mark AM may be used in a process for checking the result of laser cutting (or a cut portion of the display module 10 resulting from laser cutting which processes the generally planar shape of the display module 10) after the display module 10 coupled to the window 30 has been cut with a laser beam. Also, the align mark AM may be used to define the bezel of the display module 10 (or the display device 1).

The align mark AM may be disposed in the non-display area NDA of the display module 10.

In an embodiment, the non-display area NDA may include first to fourth detection regions AMA1 to AMA4 respectively corresponding to four corners based on the display area DA, and the align mark AM may include first to fourth align marks AM1 to AM4 respectively provided in the first to fourth detection regions AMA1 to AMA4. For example, the first detection region AMA1 may be disposed adjacent to an upper portion of the first long side LS1, and the first align mark AM1 may be provided in the first detection region AMA1. The second detection region AMA2 may be disposed adjacent to a lower portion of the first long side LS1, and the second align mark AM2 may be provided in the second detection region AMA2. The third detection region AMA3 and the fourth detection region AMA4 may be disposed on the second long side LS2 to be symmetrical with the first and second detection regions AMA1 and AMA2 with respect to the display area DA, and the third align mark AM3 and the fourth align mark AM4 may be respectively provided in the third detection region AMA3 and the fourth detection region AMA4.

In an embodiment, the non-display area NDA may further include fifth to tenth detection regions AMA5 to AMA10, and the align mark AM may include fifth to tenth align marks AM5 to AM10 respectively provided in the fifth to tenth detection regions AMA5 to AMA10. For example, the fifth detection region AMA5 and the sixth detection region AMA6 may be disposed adjacent to the first short side SS1, and the seventh detection region AMA7 and the eighth detection region AMA8 may be disposed at left/right edges of the sub-region SR in which a driving circuit (e.g., a driving integrated circuit D-IC) is arranged, and the ninth detection region AMA9 and the tenth detection region AMA10 may be disposed in portions adjacent to the bending region BR, among portions of the main region MR. In the fifth to tenth detection regions AMA5 to AMA10, fifth to tenth align marks AM5 to AM10 may be respectively provided. The fifth to tenth align marks AM5 to AM10 may be used to check the width of a dead space (e.g., distances from the fifth to tenth align marks AM5 to AM10 to the edge of the display module 10) after the process for laser cutting of the display module 10 has been performed.

Since the first to tenth align marks AM1 to AM10 are substantially identical or similar to each other, the first align mark AM1 will be described as a representative one of the first to tenth align marks AM1 to AM10.

In embodiments, the first align mark AM1 may include align patterns AMP1, AMP2, and AMP3. For example, the first align mark AM1 may be sequentially arranged along a first direction DR1, and may include the first to third align patterns AMP1 to AMP3 that are spaced apart from each other or are separated from each other.

As will be described later, two adjacent patterns, among the first to third align patterns AMP1 to AMP3, may be used as identification marks for alignment. For example, when the first and second align patterns AMP1 and AMP2 are used as identification marks and are incapable of functioning normally, the second and third align patterns AMP2 and AMP3 (or the first and third align patterns AMP1 and AMP3) may be used as identification marks.

In an embodiment, among the first to third align patterns AMP1 to AMP3, adjacent align patterns may have different planar shapes. The planar shapes of the first to third align patterns AMP1 to AMP3 will be described in detail later with reference to FIG. 7.

Each of the fifth and sixth align marks AM5 and AM6 may include three align patterns that are sequentially arranged in a second direction DR2, each of the seventh and eighth align marks AM7 and AM8 may include two align patterns, and each of the ninth and tenth align marks AM9 and AM10 may include a single align mark. That is, each of the first to tenth align marks AM1 to AM10 may include various numbers of align patterns in consideration of functions thereof (e.g., identification marks for alignment, identification marks for defining a bezel, or the like).

In embodiments, the first to third align patterns AMP1, AMP2, and AMP3 may be made of opaque material (e.g., metals). For example, when light is radiated to the first detection region AMA1 in a direction from the bottom to the top of the display module, the first to third align patterns AMP1, AMP2, and AMP3 block the light, so that shadows (or shadow images) of the first to third align patterns AMP1, AMP2, and AMP3 are generated, and thus the first to third align patterns AMP1, AMP2, and AMP3 may be identified based on the shadow images. The configurations for identifying the first to third align patterns AMP1 to AMP3 will be described in detail later with reference to FIG. 8.

FIGS. 4A and 4B are cross-sectional views illustrating exemplary embodiments of the display module of FIG. 3.

Referring to FIG. 4A, a display module 10 may include a base substrate SUB (or a substrate), a display unit DISP, and a sensing unit TSP.

The base substrate SUB may be made of insulating material, such as glass or resin. The base substrate SUB may be made of material having flexibility so as to be bendable or foldable, and may have a single layer or multilayer structure.

The display unit DISP may be formed on the base substrate SUB. The display unit DISP may include a pixel provided in the display area DA of the base substrate SUB and lines DLS (or signal lines) provided in the non-display area NDA of the base substrate SUB. The pixel may include a light-emitting element and at least one transistor coupled to the light-emitting element to provide a driving current to the light-emitting element, and at least some of the lines DLS may be directly/indirectly coupled to the pixel, and may transmit driving signals required so as to drive the pixel (or transistor).

The sensing unit TSP may be disposed on the display unit DISP, and may include a sensing electrode provided in the display area DA (or a sensing area), a sensing line provided in the non-display area NDA (or a non-sensing area) and coupled to the sensing electrode, and an align mark AM. For example, the sensing unit TSP may sense an external touch input or the like through capacitive sensing technology that uses the sensing electrode, and in this case, the sensing unit TSP may be designated as a touch sensing unit.

The sensing unit TSP may be integrated with the display unit DISP. That is, the sensing unit TSP may be directly formed on the display unit DISP, and a separate adhesive layer (e.g., OCR, OCA, or the like) may not be interposed between the display unit DISP and the sensing unit TSP.

As described above with reference to FIG. 3, the align mark AM may be provided in the non-display area NDA, and may overlap some of the lines DLS in the display unit DISP.

Although, in FIG. 4A, the sensing unit TSP has been described as being integrated with the display unit DISP, the exemplary embodiments are not limited thereto.

Referring to FIG. 4B, another exemplary embodiment of a display module 10_0 may further include an adhesive layer ADH, and the sensing unit TSP may be coupled to the display unit DISP through the adhesive layer ADH. For example, the display unit DISP and the sensing unit TSP may each be implemented as a panel, and may be manufactured independent of each other, and the sensing unit TSP may be attached to the display unit DISP through the adhesive layer ADH (e.g., OCA). The display module 10_0 may be substantially identical or similar to the display module 10 of FIG. 4A, except for the presence of the adhesive layer ADH. Thus, repeated descriptions thereof will be omitted to avoid redundancy.

FIG. 5 is a plan view illustrating an exemplary embodiment of a display unit included in the display module of FIG. 4A. In FIG. 5, a display unit DISP is briefly illustrated based on lines DLS described above with reference to FIG. 4A.

Referring to FIGS. 3 to 5, the lines DLS may be arranged to be spaced apart from each other at a constant or variable pitch (interval) within the non-display area NDA along the edge of the display area DA (or the edge of the display module). At least some of the lines DLS may be electrically coupled to a driving integrated circuit D_IC, but the exemplary embodiments are not limited thereto.

In embodiments, the lines DLS may include a signal line DL and detection lines MCD1 and MCD2.

In an embodiment, the lines DLS may include the first detection line MCD1 and the second detection line MCD2. The first detection line MCD1 may extend along the edge of the display device, and may be disposed closest to one side edge of the display device, among the lines DLS, in a plan view. Similarly, the second detection line MCD2 may extend along the edge of the display device, and may be disposed closest to the other side edge of the display device, among the lines DLS, in a plan view. The first detection line MCD1 and the second detection line MCD2 may be electrically isolated from pixels PXL, and may be electrically coupled to a driving IC D_IC, but the exemplary embodiments are not limited thereto.

The first detection line MCD1 and the second detection line MCD2 may be fault detection lines (i.e., module crack detection lines) for detecting faults (e.g., line cracks) in the display device, may be disposed in an outermost portion of the display device in a plan view, and may have line widths narrower than that of other lines (e.g., the signal line DL).

Although the display unit DISP is illustrated as including two detection lines MCD1 and MCD2 in FIG. 5, exemplary embodiments of the display unit DISP are not limited thereto. For example, the display unit DISP may include five or more detection lines on one side of the display unit DISP, wherein the attenuation of detected signals may be mitigated and the position of a faulty region in the display unit DISP may be detected.

The signal line DL may extend from the driving IC D_IC along at least a part of the edge of the display area DA, may be coupled to the pixels PXL, and may transmit driving signals required for driving of the pixels PXL.

Although the signal line DL is illustrated as being directly coupled to the corresponding pixel PXL in FIG. 5, this structure is only exemplary, and the exemplary embodiments are not limited thereto. For example, the display unit DISP may include a scan driver (or a scan driving circuit including shift registers) disposed on left and right sides of the display unit DISP and configured to sequentially generate scan signals, wherein the signal line DL are coupled to the scan driver and are capable of transmitting clock signals.

Figure 6:
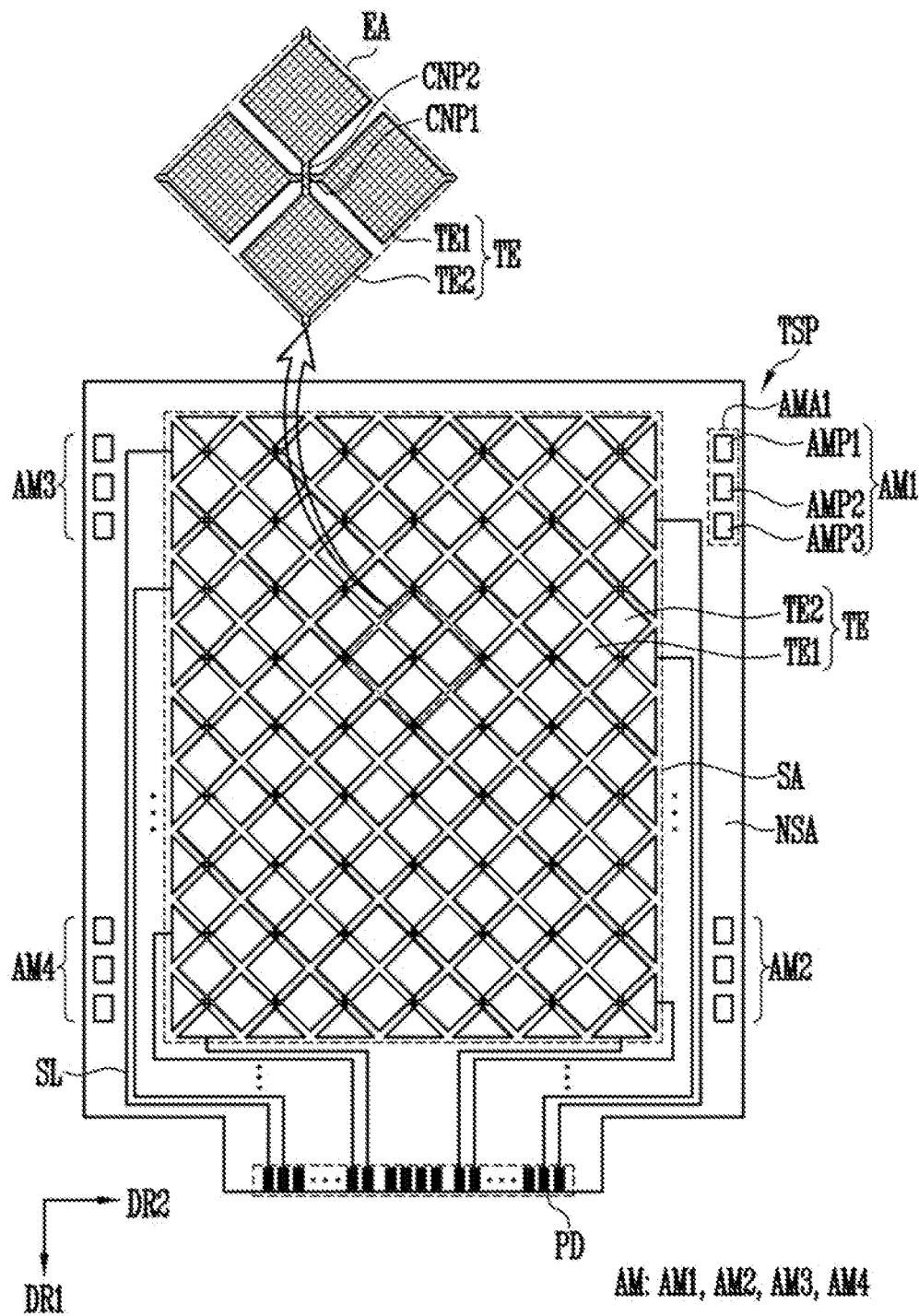
FIG. 6 is a plan view illustrating an exemplary embodiment of a sensing unit in the display module of FIG. 5, including an enlarged section.

FIG. 6 is a plan view illustrating an exemplary embodiment of a sensing unit included in the display module of FIG. 5. For convenience of description, the align mark AM in FIG. 6 is illustrated as including representative first to fourth align marks AM1 to AM4, among first to tenth align marks AM1 to AM10 described above with reference to FIG. 3.

Referring to FIGS. 3, 4A, and 6, the sensing unit TSP may include a sensing area SA and a non-sensing area NSA. The sensing area SA may correspond to the display area DA of the display device 1 (or the display module 10 or the base substrate SUB), and the non-sensing area NSA may correspond to the non-display area NDA of the display device 1.

In the sensing area SA, a sensing electrode TE may be arranged, and the non-sensing area NSA may include a sensing line SL, a pad unit PD, and an align mark AM.

The sensing electrode TE may include first sensing electrodes TE1 and second sensing electrodes TE2. The first sensing electrodes TE1 and the second sensing electrodes TE2 may be alternately (or by turns) arranged, and may be coupled in different directions.

The first sensing electrodes TE1 may be arranged in the form of a matrix, may be electrically coupled to each other along a second direction DR2, and may configure sensing electrode rows generally parallel to each other. In one sensing electrode row, each of the first sensing electrodes TE1 may be electrically coupled to an adjacent sensing electrode through a first connection pattern CNP1 (or a bridge pattern).

The second sensing electrodes TE2 may be arranged in the form of a matrix, may be electrically coupled to each other along a first direction DR1, and may configure sensing electrode columns generally parallel to each other. In one sensing electrode column, each of the second sensing electrodes TE2 may be electrically coupled to an adjacent sensing electrode through a second connection pattern CNP2.

Each of the first sensing electrodes TE1 (or sensing electrode rows) and the second sensing electrodes TE2 (or sensing electrode columns) may be electrically coupled to a sensing pad included in the pad unit PD through the sensing line SL.

In an embodiment, each of the sensing electrodes TE and the connection patterns CNP1 and CNP2 may include a plurality of fine conductive lines. For example, as enlarged and illustrated in a sensing area SA, each of the sensing electrodes TE and the connection patterns CNP1 and CNP2 may include a plurality of first fine conductive lines that are extended in one direction and are generally parallel to each other and a plurality of second fine conductive lines that are extended in a direction crossing the first fine conductive lines and are generally parallel to each other. In an embodiment, each of the sensing electrodes TE and the connection patterns CNP1 and CNP2 may have a mesh structure.

The sensing line SL may electrically couple the sensing electrode TE to a driving circuit. The sensing line SL may transfer a sensing input signal from the driving circuit to the sensing electrode TE or transfer a sensing output signal from the sensing electrode TE to the driving circuit.

As described above with reference to FIG. 3, the align mark AM may include align marks AM1 to AM4 arranged in respective detection regions AMA1 to AMA4.

The first align mark AM1 (or each of the first to fourth align marks AM1 to AM4) may include first to third align patterns AMP1, AMP2, and AMP3, and the first to third align patterns AMP1, AMP2, and AMP3 may be located independent of each other, as in the case of island patterns, may be spaced apart from the sensing line SL, may be electrically isolated from the sensing line SL, or may be insulated from the sensing line SL.

The first to third align patterns AMP1, AMP2, and AMP3 may be arranged in the outermost portion of the non-sensing area NSA of the sensing unit TSP (or the non-display area NDA). For example, the first to third align patterns AMP1, AMP2, and AMP3 of the first align mark AM1 may be arranged closer to the first side of the sensing unit TSP (e.g., the first long side LS1 of the display module 10, see FIG. 3) than the sensing line SL.

Figure 7:
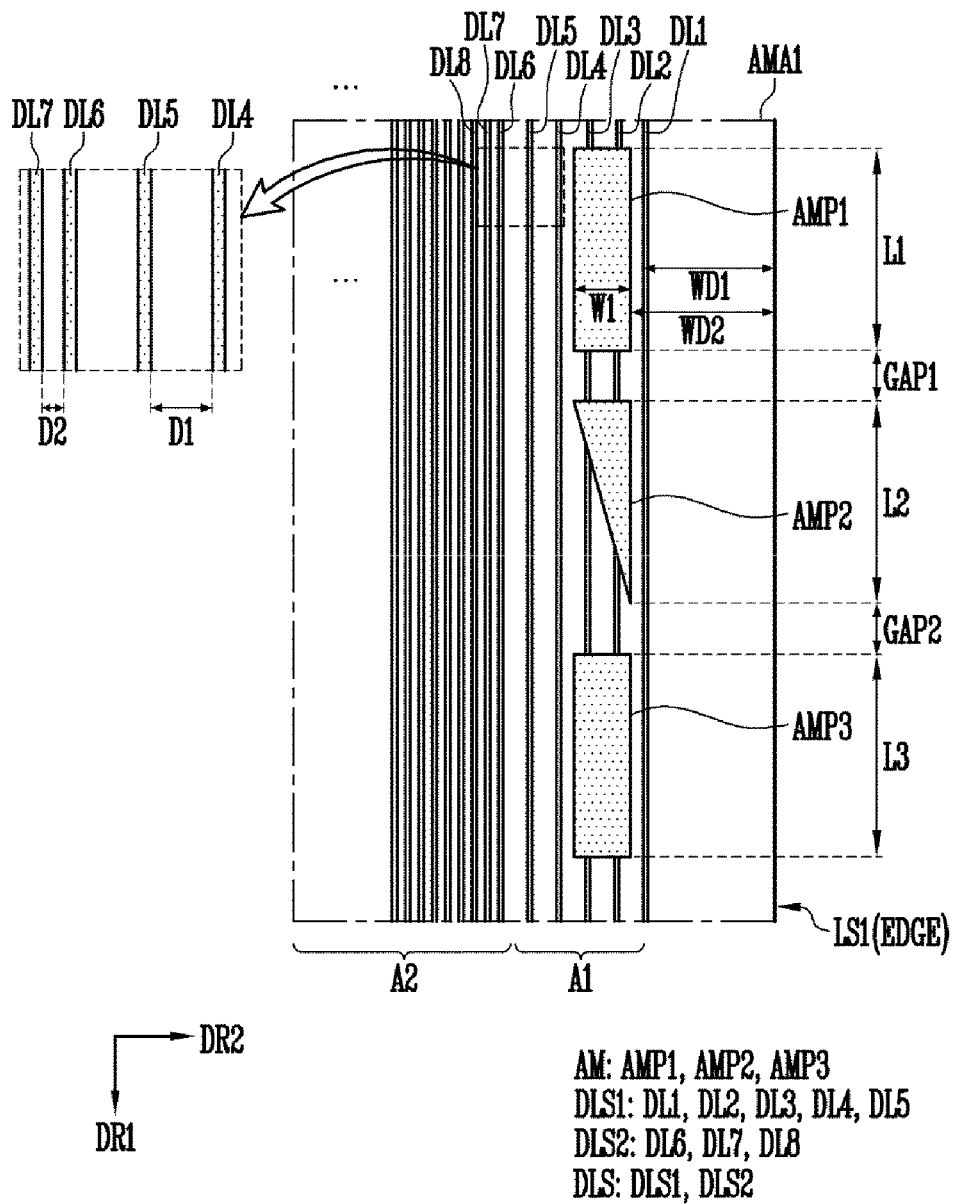
FIG. 7 is a plan view illustrating an exemplary embodiment of a display module in which a first detection region of FIG. 6 is enlarged.

FIG. 7 is a plan view illustrating an exemplary embodiment of a display module in which a first detection region of FIG. 6 is enlarged. In FIG. 7, the display module 10 is briefly illustrated based on align marks AM and lines DLS provided in a first detection region AMA1. Since relationships between the align mark AM and the lines DLS in the first to fourth detection regions AMA1 to AMA4 (or first to tenth detection regions AMA1 to AMA10, see FIG. 3) may be substantially identical or similar to the relationships between the align mark AM and the lines DLS in the first detection region AMA1, the description made below based on the first detection region AMA1 is representative of the first to fourth detection regions AMA1 to AMA4.

Referring to FIGS. 4A to 7, the lines DLS may include first to eighth lines DL1 to DL8, which may be extended along a first direction DR1 and arranged to be spaced apart from each other along a second direction DR2 (or a horizontal direction).

In embodiments, the display device may include a first area A1 in which some of the lines DLS are provided and a second area A2 in which the remaining lines other than the lines of the first area A1 are provided, where transmittance (i.e., light transmittance) of the first area A1 may be higher than that of the second area A2. The align mark AM may overlap the first area A1 in a plan view. For example, the lines DLS may include first lines DLS1 provided in the first area A1 (e.g., first line DL1 to fifth line DL5) and second lines DLS2 provided in the second area A2 (e.g., sixth line DL6 to eighth line DL8). Here, at least some of the first lines DLS1 may be a first detection line MCD1, described above with reference to FIG. 5.

In an embodiment, a first interval D1 between the first lines DLS1 (i.e., some of the lines DLS and a line adjacent thereto) may be greater than a second interval D2 between the second lines DLS2 (i.e., the remaining lines of the lines DLS). For example, the first interval D1 between the fourth line DL4 and the fifth line DL5, among the first lines DLS1, may be greater than the second interval D2 between the sixth line DL6 and the seventh line DL7, among the second lines DLS2. For example, the second interval D2 may be 2 µm or less, and the first interval D1 may be about 20 µm to about 30 µm. That is, wiring density of the first lines DLS1 in the first area A1 may be lower than that of the second lines DLS2 in the second area A2. Since the lines DLS may be made of opaque material (e.g. metal material) which reflects or absorbs light, the transmittance of the first area A1 may differ from that of the second area A2 depending on the different intervals of the lines DLS.

In an example, the line width of the first lines DLS1 may be smaller than that of the second lines DLS2. Even if the wiring density (or the number of lines) of the first lines DLS1 in the first area A1 is equal to the wiring density (or the number of lines) of the second lines DLS2 in the second area A2, the transmittance of the first area A1 may be increased depending on the line width of the first lines DLS1.

Figure 8:
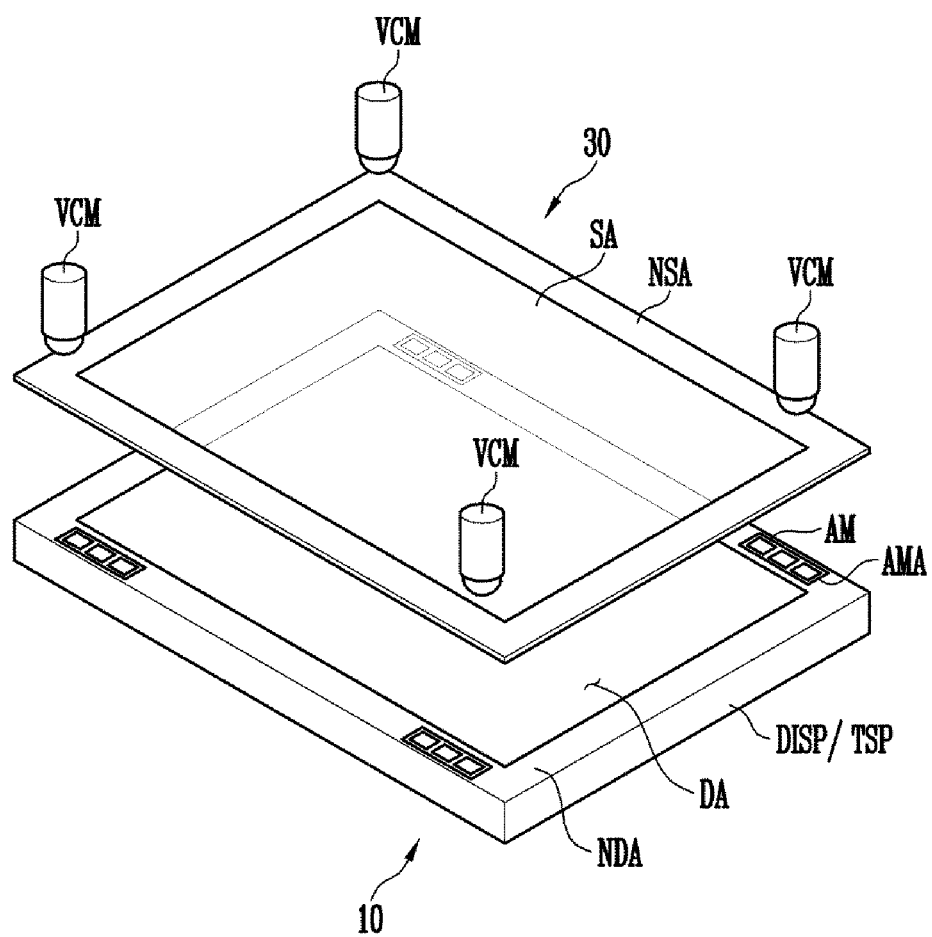
FIG. 8 is an exploded perspective view for explaining an exemplary procedure in which a display module and a window included in the display device of FIG. 2 are aligned with each other.

Since the transmittance of the first area A1 is relatively large (e.g., 90% or more), the align mark AM overlapping the first lines DLS1 in the first area A1 may be identified through an alignment device (e.g., a vision camera VCM, see FIG. 8).

The align mark AM may include first to third align patterns AMP1, AMP2, and AMP3, wherein the first to third align patterns AMP1, AMP2, and AMP3 may be arranged to be spaced apart from each other along a first direction DR1, and may overlap at least some of the first lines DLS1. For example, the first to third align patterns AMP1, AMP2, and AMP3 may overlap the second line DL2 and the third line DL3, but they are not limited thereto.

In embodiments, in a plan view, a first shortest distance WD1 (or a first shortest separation distance) from one of the lines DLS to the edge of the display module 10 (or a base substrate SUB, see FIG. 4A) may be less than a second shortest distance WD2 from the align mark AM to the edge of the display module 10 (or the base substrate SUB, see FIG. 4A). For example, the first shortest distance WD1 from the first line DL1, which is arranged in the outermost portion among the lines DLS, to the first long side LS1 of the display module 10 (or the edge of the display module) may be less than the second shortest distance WD2 from the align mark AM (or the first align pattern AMP1) to the first long side LS1 of the display module 10 (or the edge of the display module). However, the exemplary embodiments are not limited thereto. For example, the first shortest distance WD1 may be equal to the second shortest distance WD2, or may be greater than the second shortest distance WD2 within a range in which the align mark AM overlaps the first lines DLS1.

In embodiments, among the first to third align patterns AMP1, AMP2, and AMP3, adjacent align patterns may have different planar shapes.

For example, the first align pattern AMP1 may have a generally rectangular planar shape (or a generally elongate bar shape), and the second align pattern AMP2 adjacent to the first align pattern AMP1 may have a generally triangular planar shape. Similarly, the third align pattern AMP3 adjacent to the second align pattern AMP2 may have a generally rectangular planar shape. The third align pattern AMP3 may have a generally planar shape identical to that of the first align pattern AMP1. An alignment system (or a vision camera) which recognizes the align mark AM may detect the location of the display module 10 based on the first and second align patterns AMP1 and AMP2, and may also detect the location of the display module 10 based on the second and third align patterns AMP2 and AMP3. However, when all of the first to third align patterns AMP1, AMP2, and AMP3 have substantially the same shape, an error may occur when determining whether two detected align patterns are first and second align patterns AMP1 and AMP2 or are second and third align patterns AMP2 and AMP3, and thus two adjacent patterns of the first to third align patterns AMP1, AMP2, and AMP3 may have different planar shapes.

However, the planar shapes of the first to third align patterns AMP1, AMP2, and AMP3 are not limited thereto. For example, the first to third align patterns AMP1, AMP2, and AMP3 may have various planar shapes, such as a generally semicircular shape, a generally trapezoidal shape, a generally "C" shape, a generally "L" shape, and a generally star shape, and may have different planar shapes.

In embodiments, the lengths L1, L2, and L3 of the first to third align patterns AMP1, AMP2, and AMP3 in the first direction DR1 may be greater than the width W1 of each of the align patterns in the second direction DR2. Also, intervals GAP1 and GAP2 between the first to third align patterns AMP1, AMP2, and AMP3 may be less than the lengths L1, L2, and L3 of the align patterns in the first direction DR1.

In an embodiment, respective lengths L1, L2, and L3 of the first to third align patterns AMP1, AMP2, and AMP3 may be within a range from about 100 µm to about 500 µm, and the width W1 of each of the first to third align patterns AMP1, AMP2, and AMP3 may be within a range from about 30 µm to about 150 µm. In this case, respective lengths L1, L2, and L3 of the first to third align patterns AMP1, AMP2, and AMP3 may be about three to six times as large as the width W1.

In an embodiment, the lengths L1, L2, and L3 of the first to third align patterns AMP1, AMP2, and AMP3 may be about 200 µm, and the width W1 of each of the first to third align patterns AMP1, AMP2, and AMP3 may be about 40 µm or about 50 µm.

Since the dead space of the display module 10 corresponds to or is proportional to the first shortest distance WD1 or the second shortest distance WD2, the width W1 of each of the first to third align patterns AMP1, AMP2, and AMP3 may be more restrictive than the lengths L1, L2, and L3.

Since the width W1 of each of the first to third align patterns AMP1, AMP2, and AMP3 is decreased, the width of the first area A1 in which the first lines DLS1 overlapping the align mark AM are arranged may be reduced, and thus the dead space may be further reduced. Also, as respective lengths L1, L2, and L3 of the first to third align patterns AMP1, AMP2, and AMP3 are increased (i.e., as respective areas of the first to third align patterns AMP1, AMP2, and AMP3 are increased), the recognition rate of the align mark AM may be prevented from being decreased due to the decrease in W1.

As the performance of the alignment system which recognizes the align mark AM (e.g., the resolution of a vision camera) is improved, the align mark AM may be recognized even if the width W1 of each of the first to third align patterns AMP1, AMP2, and AMP3 is decreased. However, as the first lines DLS1 overlapping the align mark AM are recognized, the align mark AM may not be desirably recognized due to the first lines DLS1. Therefore, in consideration of the visibility of the align mark AM and the non-visibility of the first lines DLS1, the width W1 of each of the first to third align patterns AMP1, AMP2, and AMP3 may be set to about 40 µm or 50 µm.

Although in FIG. 7, the first length L1 of the first align pattern AMP1, the second length L2 of the second align pattern AMP2, and the third length L3 of the third align pattern AMP3 are illustrated as being substantially equal to each other, the lengths of the align patterns are not limited thereto, and the first to third lengths L1, L2, and L3 may be different from each other. Similarly, the widths of the first to third align patterns AMP1, AMP2, and AMP3 may be equal to or different from each other.

FIG. 8 is an exploded perspective view for explaining an exemplary procedure in which a display module and a window included in the display device of FIG. 2 are aligned with each other.

Referring to FIG. 8, vision cameras VCM may be arranged on one surface of the display module 10 (e.g., a surface where an image is displayed). Also, the vision cameras VCM may be arranged on the top of the window 30. The vision cameras VCM may be arranged to correspond to the non-display area NDA of the display module 10.

The vision cameras VCM may acquire images (or align mark images) of an align mark AM (or a detection region AMA) of the display module 10 through light emitted from a light source. An alignment device may detect the align mark AM based on the images acquired by the vision cameras VCM, may determine whether alignment between the display module 10 and the window 30 has been performed based on the detected align mark AM, and may couple the window 30 to the display module 10 when it is determined that the alignment between the display module 10 and the window 30 has been performed.

The light source may be disposed on the bottom of the display module 10 (e.g., on the rear surface of the display module 10), and each vision camera VCM may acquire an align mark image including the shadow of the align mark AM, that is, an align mark image matching the align mark AM. However, the exemplary embodiments are not limited thereto, and the light source may be disposed on one surface (e.g., the display surface) of the display module 10, and each vision camera VCM may also acquire an align mark image for reflected light that has been reflected by the align mark AM.

The alignment device may extract feature points of each align mark image (e.g., inflection points or shapes of the inflection points) and match the extracted feature points with preset feature points, or may match the align mark image with a preset reference align mark image, calculate matching scores, and recognize the align mark AM based on the matching scores.

Figure 9:
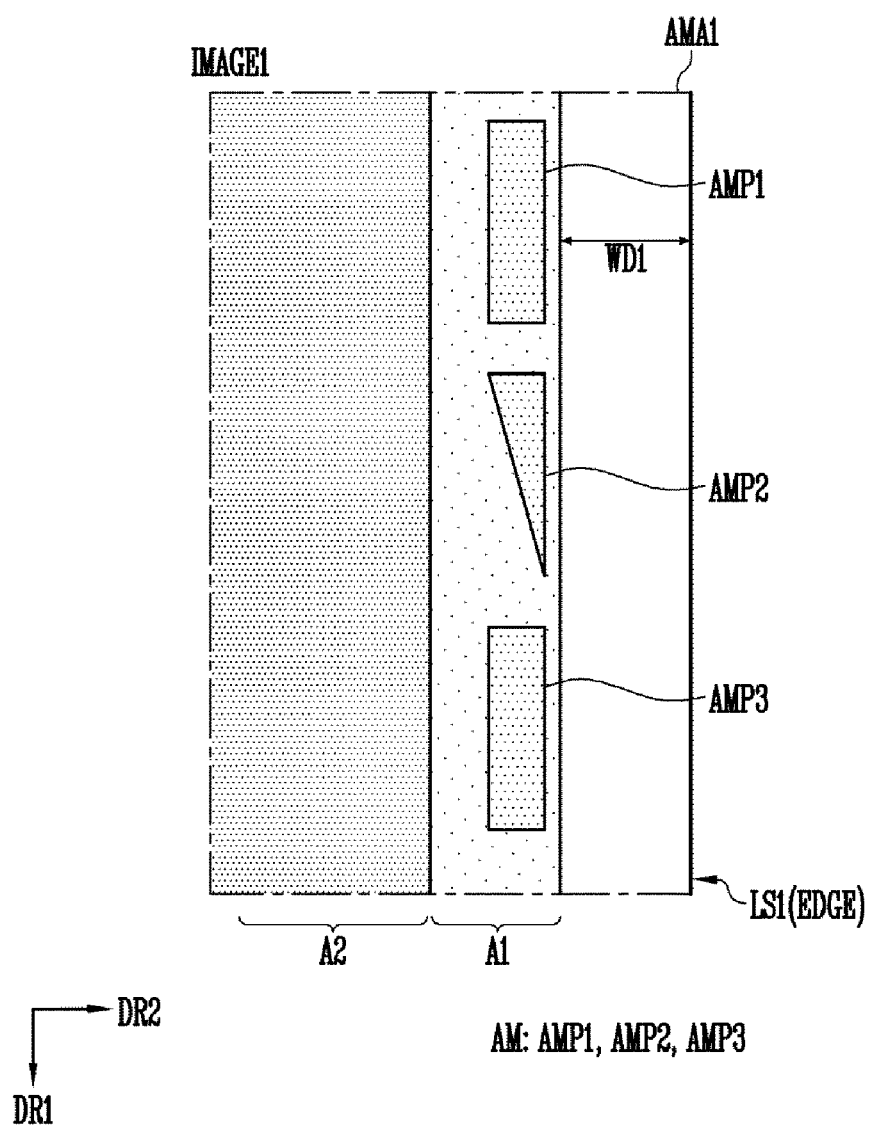
FIG. 9 is a plan view illustrating an exemplary embodiment of an image obtained by capturing the first detection region of FIG. 7.

FIG. 9 is a plan view illustrating an exemplary embodiment of an image obtained by capturing the first detection region of FIG. 7.

In FIG. 9, an image IMAGE1 of the first detection region AMA1 acquired from the vision camera VCM of FIG. 8 is depicted.

Referring to FIGS. 7 and 9, the align mark AM (or first to third align patterns AMP1, AMP2, and AMP3) may be made of opaque material, and may be indicated in black in the image IMAGE1.

Similarly, as the transmittance of a second area A2 of the display device is relatively low, that is, as the wiring density of second lines DLS2 (see FIG. 7) arranged in the second area A2 is high, most of light radiated to the second area A2 may be blocked. Also, the resolution (or resolving power) of the vision camera VCM may be greater than the second interval D2 between the second lines DLS2. That is, the second lines DLS2 in the second area A2 may be recognized as a single surface depending on the viewing angle and resolution (or resolving power) of the vision camera VCM. For example, when the vision camera VCM spaced apart from the display module 10 by a specific distance has a resolution of a maximum of 3 µm, the second lines DLS2 may be arranged to be spaced apart from each other by an interval less than the resolution of the vision camera VCM, for example, an interval of 2 µm. In this case, the second lines DLS2 may be recognized as a single surface by the vision camera VCM. In this case, the second area A2 may be entirely displayed in black.

Since the transmittance of the first area A1 of the display device is relatively high, that is, since the wiring density of the first lines DLS1 (see FIG. 7) arranged in the first area A1 is low, most of light radiated to the first area A1 may not be blocked. In this case, the first area A1 (i.e., the first area A1 except for the align mark AM) may be displayed brighter than the second area A2 in such a way that the first area A1 is displayed in light gray.

Even if the second lines DLS2 in the second area A2 are partially perceived, an image corresponding to the second lines DLS2 (i.e., the second lines DLS2 having a relatively large second interval D2) may be removed through image processing (e.g., an image smoothing technique) on the image IMAGE1.

Since separate lines are not arranged in a region extending from the edge of the first area A1 to the edge of the display module 10 defined by first shortest distance WD1, all of light may pass through the region, and this region may appear brighter than the first area A1 in such a way as to be displayed, for example, in white.

Therefore, even if the align mark AM is provided in the first area A1 while overlapping the first lines DLS1 (see FIG. 7), the align mark AM may be accurately detected or recognized.

Figure 10:
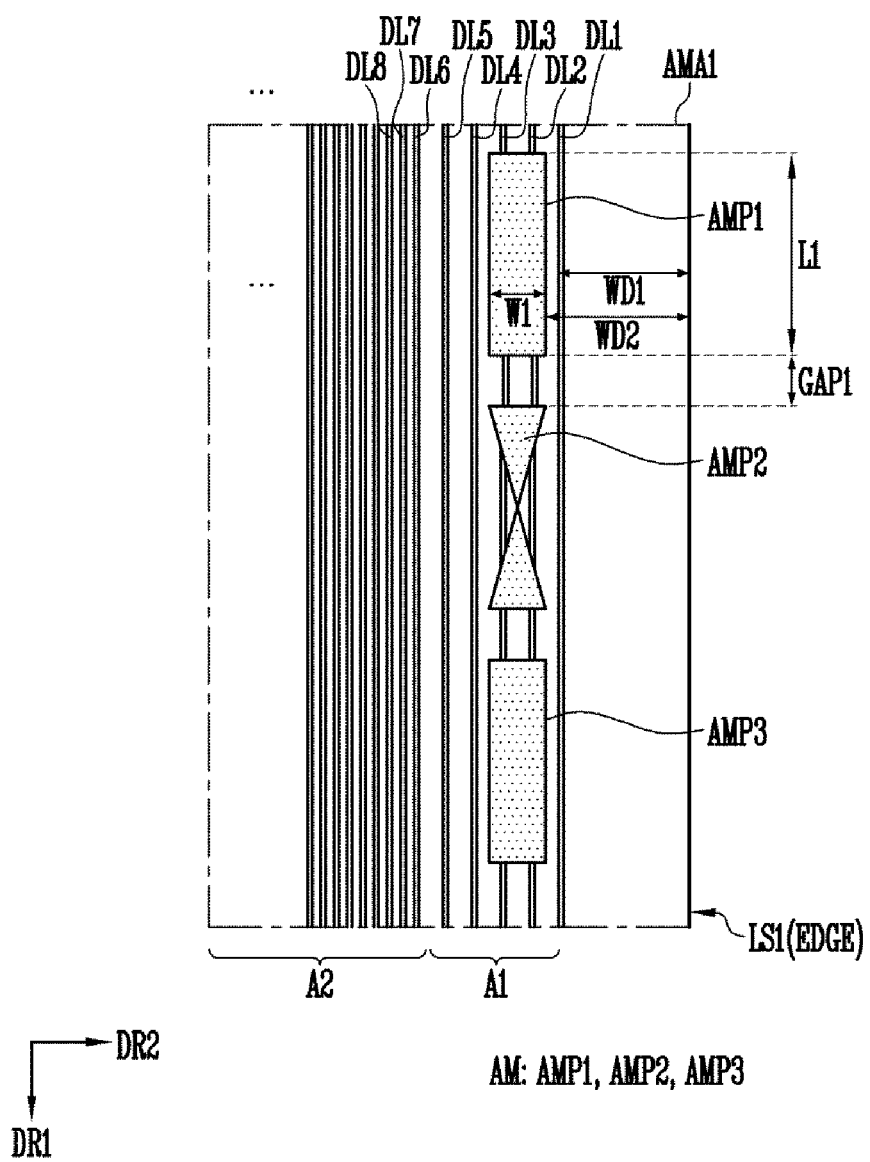
FIG. 10 is a plan view illustrating an exemplary embodiment of a display module in which a first detection region of FIG. 6 is enlarged.

FIG. 10 is a plan view illustrating an exemplary embodiment of a display module in which a first detection region of FIG. 6 is enlarged. In FIG. 10, an align mark AM and lines DSL corresponding to the display module 10 of FIG. 7 are illustrated.

Referring to FIGS. 6, 7, and 10, the display module 10 of FIG. 10 is substantially identical or similar to the display module 10 of FIG. 7, except for the shape of a second align pattern AMP2, and thus repeated descriptions thereof will be omitted to avoid redundancy.

The second align pattern AMP2 may have a generally planar shape of double triangles. As illustrated in FIG. 10, the second align pattern AMP2 may have the generally planar shape of double triangles that are implemented as two triangles arranged to be mutually symmetrical with each other. Since the double triangles include a larger number of feature points than a normal triangle, a false recognition rate for the second align pattern AMP2 (or the align mark AM) may be further reduced than a rectangle or a single triangle.

Figure 11:
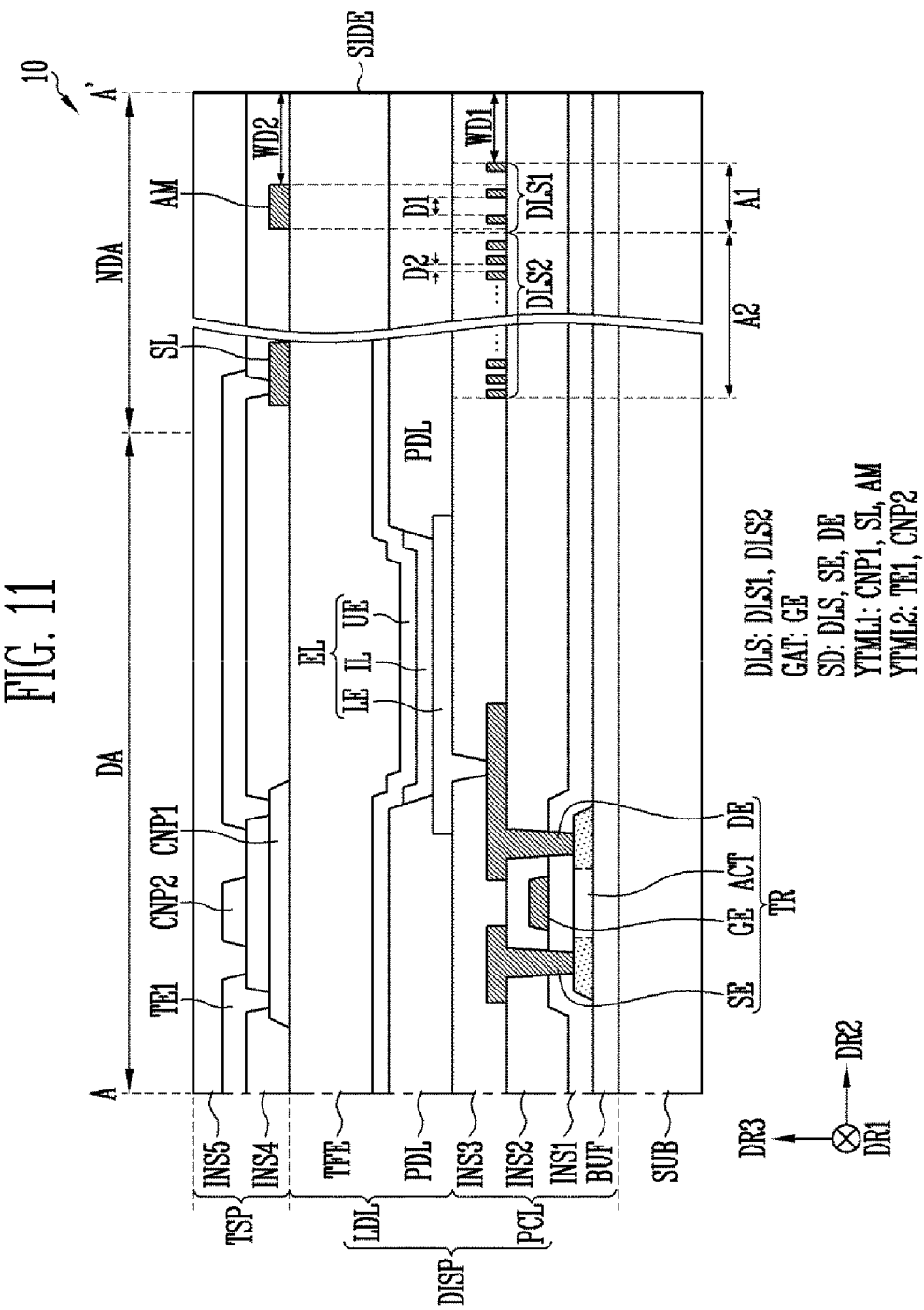
FIG. 11 is a cross-sectional view illustrating an exemplary embodiment of a display module taken along line A-A' of FIG. 2.

FIG. 11 is a cross-sectional view illustrating an exemplary embodiment of a display module taken along line A-A' of FIG. 2.

Referring to FIGS. 2 to 6 and 11, the display module 10 may include a base substrate SUB, at least one transistor TR, lines DLS (or conductive lines), a light-emitting element EL, and an encapsulation layer TFE (or the display unit DISP), sensing electrodes TE1 and TE2 and a sensing line SL (or the sensing unit TSP), and an align mark AM.

The base substrate SUB may be made of insulating material, such as glass or resin. The base substrate SUB may be made of material having flexibility so as to be bendable or foldable, and may have a single layer or multilayer structure.

For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material used to form the base substrate SUB is not limited thereto. For example, the base substrate SUB may also be made of fiber-glass reinforced plastics (FRP) or the like.

The base substrate SUB may include a display area DA, and a non-display area NDA provided on one side of the display area DA.

The transistor TR (or a pixel circuit PCL, a pixel circuit layer) may be disposed on the base substrate SUB, the transistor TR may be provided in the display area DA of the base substrate SUB, and lines DLS may be provided in the non-display area NDA of the base substrate SUB.

The transistor TR (or pixel circuit layer PCL) may include, a semiconductor pattern (or a semiconductor layer), a gate electrode GE (or a first conductive layer GAT), source and drain electrodes (or a second conductive layer SD) disposed between a buffer layer BUF and insulating layers INS1, INS2, and, INS3.

The buffer layer BUF may be disposed on an entire surface of the base substrate SUB. The buffer layer BUF may prevent impurity ions from being diffused, may prevent water or external air from permeating into the display module, and may perform a surface-planarization function. The buffer layer BUF may include silicon nitride, silicon oxide, or silicon oxynitride. The buffer layer BUF may be omitted depending on the type of the base substrate SUB or processing conditions.

The semiconductor pattern may be disposed on the buffer layer BUF (or the base substrate SUB). The semiconductor pattern may be an active layer forming the channel of the transistor TR. The semiconductor pattern may include a source region and a drain region which are in contact with a source electrode SE and a drain electrode DE, respectively, which will be described later. A region between the source region and the drain region may be a channel region ACT.

The semiconductor pattern may include polysilicon, amorphous silicon, an oxide semiconductor, or the like. The channel region ACT of the semiconductor pattern may be a semiconductor pattern undoped with impurities, and may then be an intrinsic semiconductor. Each of the source region and the drain region may be an impurity-doped semiconductor pattern. Impurities such as n-type impurities, p-type impurities or other metals may be used as the impurities.

The first insulating layer INS1 (or a gate insulating layer) may be disposed on the semiconductor pattern and the buffer layer BUF (or the base substrate SUB). The first insulating layer INS1 may be disposed on an entire surface of the base substrate SUB. The first insulating layer INS1 may be a gate-insulating layer having a gate-insulating function.

The first insulating layer INS1 may include an inorganic insulating material, such as a silicon compound or a metal oxide. For example, the first insulating layer INS1 may include silicon oxide, silicon nitride, silicon oxynitride, aluminum oxide, tantalum oxide, hafnium oxide, zirconium oxide, titanium oxide, or mixtures thereof. The first insulating layer INS1 may have a single-layer structure, or may have a multilayer structure composed of a plurality of stacked layers made of different materials.

The gate electrode GE (or the first conductive layer GAT) may be disposed on the first insulating layer INS1. The gate electrode GE may be disposed to overlap the semiconductor layer (or the channel region ACT of the semiconductor layer).

The gate electrode GE may include metals corresponding to one or more selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu). The gate electrode GE may have a single-layer structure or a multilayer structure.

The display module 10 may further include a gate line formed in the same layer as the gate electrode GE. The gate line may be electrically coupled to the gate electrode GE, may extend to the non-display area NDA in a plan view, and may be electrically coupled to a driving integrated circuit D_IC. The gate line may transfer a gate signal provided from the driving integrated circuit D_IC to the gate electrode GE of the transistor TR.

The second insulating layer INS2 (or interlayer insulating layer) may be disposed on the gate electrode GE, and may be disposed on the entire surface of the base substrate SUB. The second insulating layer INS2 may function to insulate the gate electrode GE from the source and drain electrodes SE and DE, and may be an interlayer insulating layer.

The second insulating layer INS2 may include an inorganic insulating material, such as silicon oxide, silicon nitride, silicon oxynitride, hafnium oxide, aluminum oxide, titanium oxide, tantalum oxide or zinc oxide, or an organic insulating material, such as polyacrylate resin, epoxy resin, phenolic resin, polyamide resin, polyimide resin, unsaturated polyester resin, polyphenylene ether resin, polyphenylene sulfide resin, or benzocyclobutene (BCB). The second insulating layer INS2 may have a single-layer structure, or may have a multilayer structure composed of a plurality of stacked layers made of different materials.

The source and drain electrodes SE and DE (or a second conductive layer SD) may be disposed on the second insulating layer INS2. The line DLS may be disposed in the same layer as the source and drain electrodes SE and DE.

The source electrode SE and the drain electrode DE may be in contact with the source region and the drain region of the semiconductor pattern through contact holes that are formed through the second insulating layer INS2 and the first insulating layer INS1, respectively.

The lines DLS may include first lines DLS1 and second lines DLS2.

Some of the second lines DLS2 may be electrically coupled to the source electrode SE, may extend to the non-display area NDA in a plan view, and may be electrically coupled to the driving integrated circuit D_IC (see FIG. 3). As the second lines DLS2 have been described with reference to FIG. 7, repeated descriptions thereof will be omitted to avoid redundancy.

The first lines DLS1 may include a first detection line MCD1 (or a second detection line MCD2), described above with reference to FIG. 5. Since the first shortest distance WD1 and the first interval D1 of the first lines DLS1 have been described with reference to FIG. 7, repeated descriptions thereof will be omitted to avoid redundancy.

Similar to the gate electrode GE, the source and drain electrodes SE and DE and lines DLS may include metals corresponding to one or more selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu). The source and drain electrodes SE and DE and lines DLS may have a single-layer structure or a multilayer structure.

The third insulating layer INS3 (or passivation layer) may be disposed on the source and drain electrodes SE and DE and lines DLS.

The light-emitting element unit LDL may be disposed on the pixel circuit PCL. The light-emitting element unit LDL may include at least one light-emitting element EL, provided in the display area DA and coupled to at least one transistor TR, and an encapsulation layer TFE.

The light-emitting element EL (or the light-emitting element unit LDL) may include a first electrode LE (or a lower electrode), a second electrode UE (or an upper electrode), and an emissive layer IL (or an intermediate layer). Also, the light-emitting element EL may further include a pixel-defining layer PDL. Any one of the first electrode LE and the second electrode UE may be an anode electrode, and the other may be a cathode electrode. For example, the first electrode LE may be the anode electrode, and the second electrode UE may be the cathode electrode.

The first electrode LE may be electrically coupled to the drain electrode DE of the transistor TR through a contact hole that is formed through the third insulating layer INS3.

The pixel-defining layer PDL may be disposed along the edge of the first electrode LE, and may include an organic insulating material.

The emissive layer IL may be disposed on the top of the first electrode LE exposed by the pixel-defining layer PDL. The emissive layer IL may include a low-molecular or high-molecular substance.

The second electrode UE may be disposed on the emissive layer IL. The second electrode UE may be a common electrode formed on an entire surface of the emissive layer IL and the pixel-defining layer PDL. The second electrode UE may be a transparent or semitransparent electrode.

The encapsulation layer TFE may be disposed on the second electrode UE. The encapsulation layer TFE may prevent water and air that may flow from outside from penetrating into the light-emitting element EL. The encapsulation layer TFE may be formed through thin film encapsulation, and may include one or more organic layers and one or more inorganic layers. For example, the organic layer may be formed to include any one selected from the group consisting of epoxy, acrylate, and urethane acrylate, and the inorganic layer may be formed to include one or more selected from the group consisting of silicon oxide ($SiO_x$), silicon nitride ($SiN_x$), and silicon oxynitride ($SiON_x$).

Figure 12:
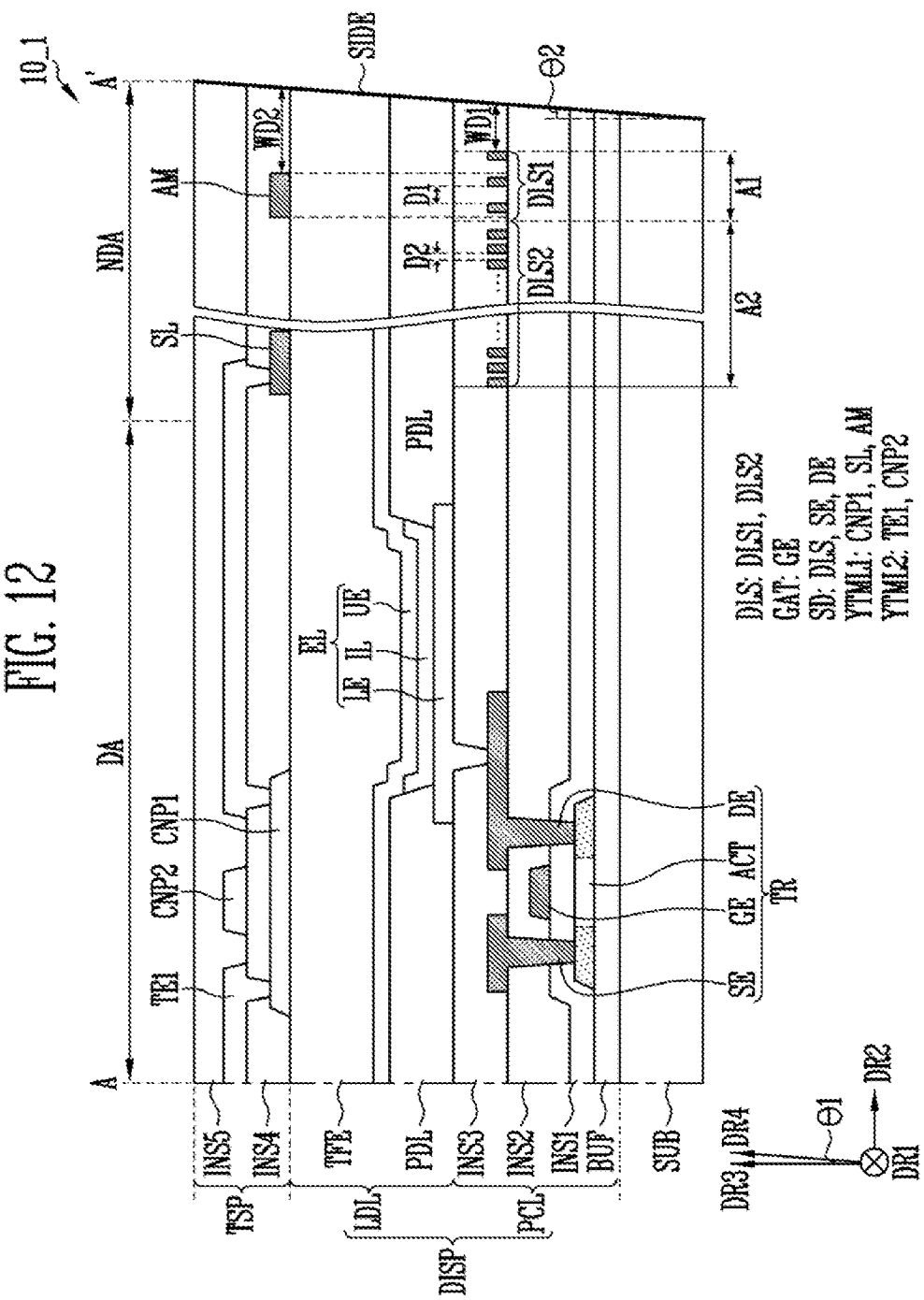
FIGS. 12 to 15 are cross-sectional views illustrating various exemplary embodiments of a display module taken along line A-A' of FIG. 2.

Although the light-emitting element unit LDL is illustrated as including an organic light-emitting element in FIG. 12, the light-emitting element unit LDL is not limited thereto, and may include an inorganic light-emitting element or the like.

The sensing electrode TE, the sensing line SL, and the align mark AM may be disposed on the encapsulation layer TFE. The sensing electrode TE may be provided in the display area DA (or sensing area), and the sensing line SL may be provided in the non-display area NDA and coupled to the sensing electrode TE.

The sensing unit TSP may include first sensing electrodes TE1 and first and second connection patterns CNP1 and CNP2 (or a third and fourth conductive layers YTML1 and YTML2, first and second conductive patterns) disposed between the encapsulation layer TFE and fourth and fifth insulating layer INS4 and INS5.

The first connection pattern CNP1 (or the third conductive layer YTML1) may be disposed on the encapsulation layer TFE. The sensing line SL and the align mark AM may be disposed in the same layer as the first connection pattern CNP1. The align mark AM may be disposed directly on the encapsulation layer TFE.

The sensing line SL and the align mark AM may be arranged in the non-display area NDA (or the non-sensing area of the sensing unit TSP).

The align mark AM may be provided in the first area A1, and may overlap some of the lines DLS, that is, first lines DLS1. Since the second shortest distance WD2 and the size of the align mark AM have been described above with reference to FIG. 7, repeated descriptions thereof will be omitted to avoid redundancy.

The fourth insulating layer INS4 may be disposed on and cover the first connection pattern CNP1, the sensing line SL, and the align mark AM. Also, the fourth insulating layer INS4 may be disposed on the encapsulation layer TFE that is partially exposed by first connection pattern CNP1, the sensing line SL, and the align mark AM.

The first sensing electrode TE1 and the second connection pattern CNP2 may be disposed on the fourth insulating layer INS4, and the second sensing electrode TE2 (see FIG. 6) may also disposed on the fourth insulating layer INS4. As described above with reference to FIG. 6, the first sensing electrode TE1, the second connection pattern CNP2, and the second sensing electrode TE2 may be provided in the display area DA (or the sensing area SA of the sensing unit TSP). The first sensing electrode TE1 may be individually, electrically coupled to the first connection pattern CNP1 and the sensing line SL through contact holes that are formed through the fourth insulating layer INS4.

The fifth insulating layer INS5 may be disposed on the first sensing electrode TE1 and the second connection pattern CNP2, and may be formed on an entire surface of the encapsulation layer TFE.

As described above with reference to FIG. 11, the align mark AM may be provided on the encapsulation layer TFE, and may be disposed to overlap the first lines DLS1.

FIGS. 12 to 15 are cross-sectional views illustrating various exemplary embodiments of a display module taken along line A-A' of FIG. 2. In FIGS. 12 to 15, cross-sectional views of the display modules 10_1 to 10_4 may be substantially similar to the display module 10 corresponding to FIG. 11. Thus, repeated descriptions of common elements will be omitted to avoid redundancy.

First, referring to FIGS. 11 and 12, the display module 10_1 is different from the display module 10 of FIG. 11 in that the display module 10_1 includes an inclined side surface SIDE.

The display module 10_1 (or the display device) may be processed (or cut) using laser.

A laser beam may be radiated to the rear surface of the display module 10_1 in a third direction DR3 or a fourth direction DR4. Here, the third direction DR3 may be identical to the direction in which light is emitted from the display module 10_1, and the fourth direction DR4 may form a first specific angle Θ1 towards the outside of the display module 10_1 with respect to the third direction DR3. For example, the first specific angle Θ1 may fall within a range from about 0.1 to about 5 degrees, a range from about 0.3 to about 3 degrees, or a range from about 0.5 to about 2 degrees. When a laser beam is radiated in the third direction DR3 or the fourth direction DR4, the display area DA of the display module 10_1 may not be damaged even if a laser beam is reflected by the first electrode LE or the second electrode UE included in the display module 10_1.

When the display module 10_1 is cut by a laser beam, a laser beam traveling along the third direction DR3 or the fourth direction DR4 is used, and the rear surface of the display module 10_1 is supplied with a relatively large amount of energy, and thus the side surface SIDE (or a laser-etched surface) of the display module 10_1 may have a reversely tilted structure. The side surface SIDE of the display module 10_1 may form a second specific angle Θ2 towards the outside of the display module 10_1 with respect to the third direction DR3. For example, the second specific angle θ2 may fall within a range from about 3 to about 5 degrees.

Since the side surface SIDE of the display module 10_1 is processed through laser processing, the side surface of the display unit DISP and the side surface of the sensing unit TSP may each form an acute angle with the thickness direction (i.e., the third direction DR3) of the display unit DISP, wherein the side surface of the display unit DISP and the side surface of the sensing unit TSP may be located in the same or identical plane (coplanar).

Since the align mark AM is formed on the encapsulation layer TFE, the side surface SIDE of the display module 10_1 may be located more inwardly from the display module 10_1 than a typical display module (e.g., a display module including an align mark formed in the same layer as the transistor TR). Therefore, the dead space of the display module 10_1 may be further decreased.

Figure 13:
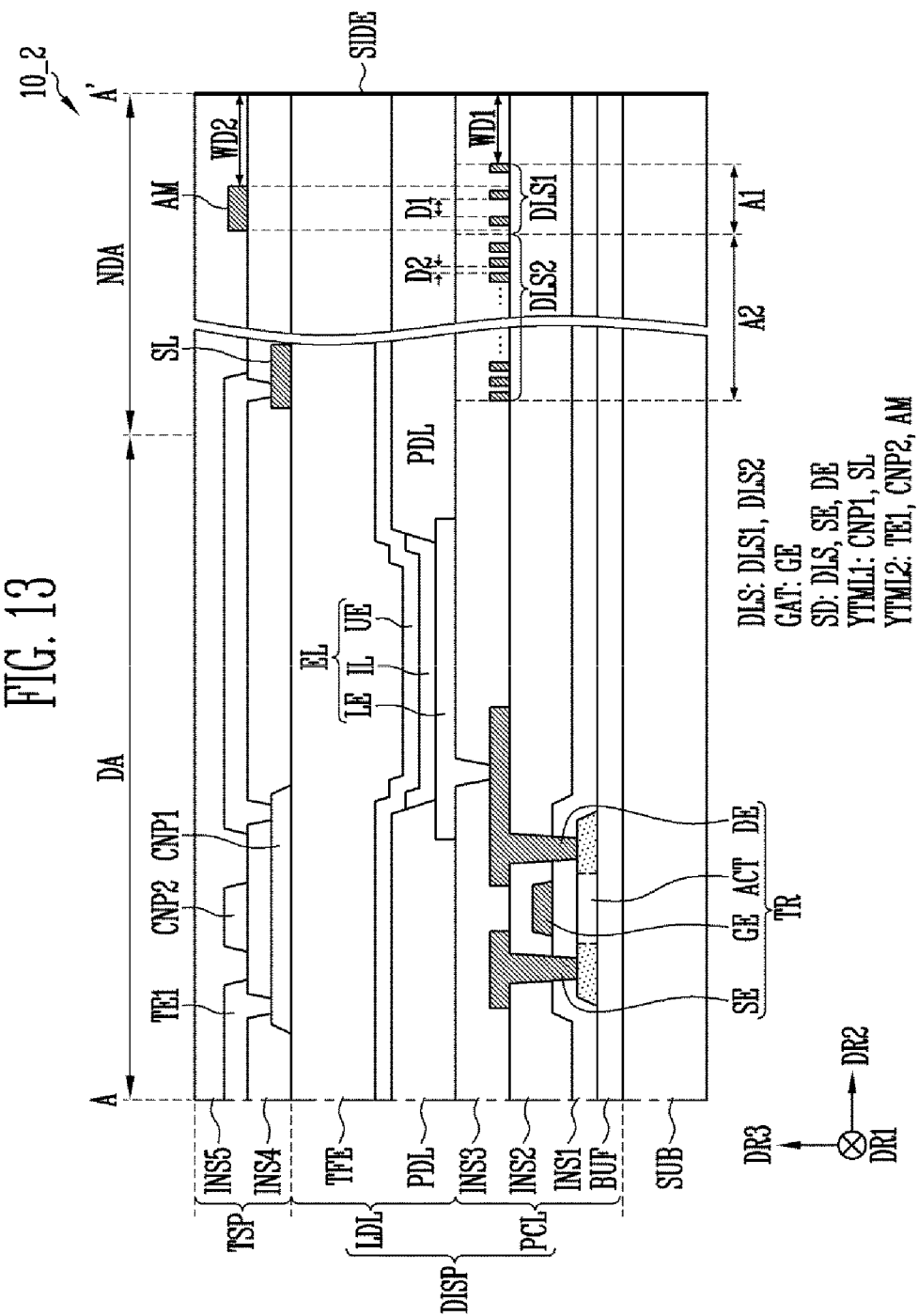

Referring to FIGS. 11 and 13, the display module 10_2 is different from the display module 10 of FIG. 11 in that the display module 10_2 includes an align mark AM formed in the same layer as the first sensing electrode TE1 (or, the fourth conductive layer YTML2).

The align mark AM may be provided in a first area A1, and may overlap some of the lines DLS, that is, first lines DLS1. Since the shortest distance WD2 and the size of the align mark AM have been described above with reference to FIG. 7, repeated descriptions thereof will be omitted to avoid redundancy.

That is, the align mark AM may be included in the sensing unit TSP, and may be formed in the same layer as the first connection pattern CNP1 or the first electrode TE1.

Figure 14:
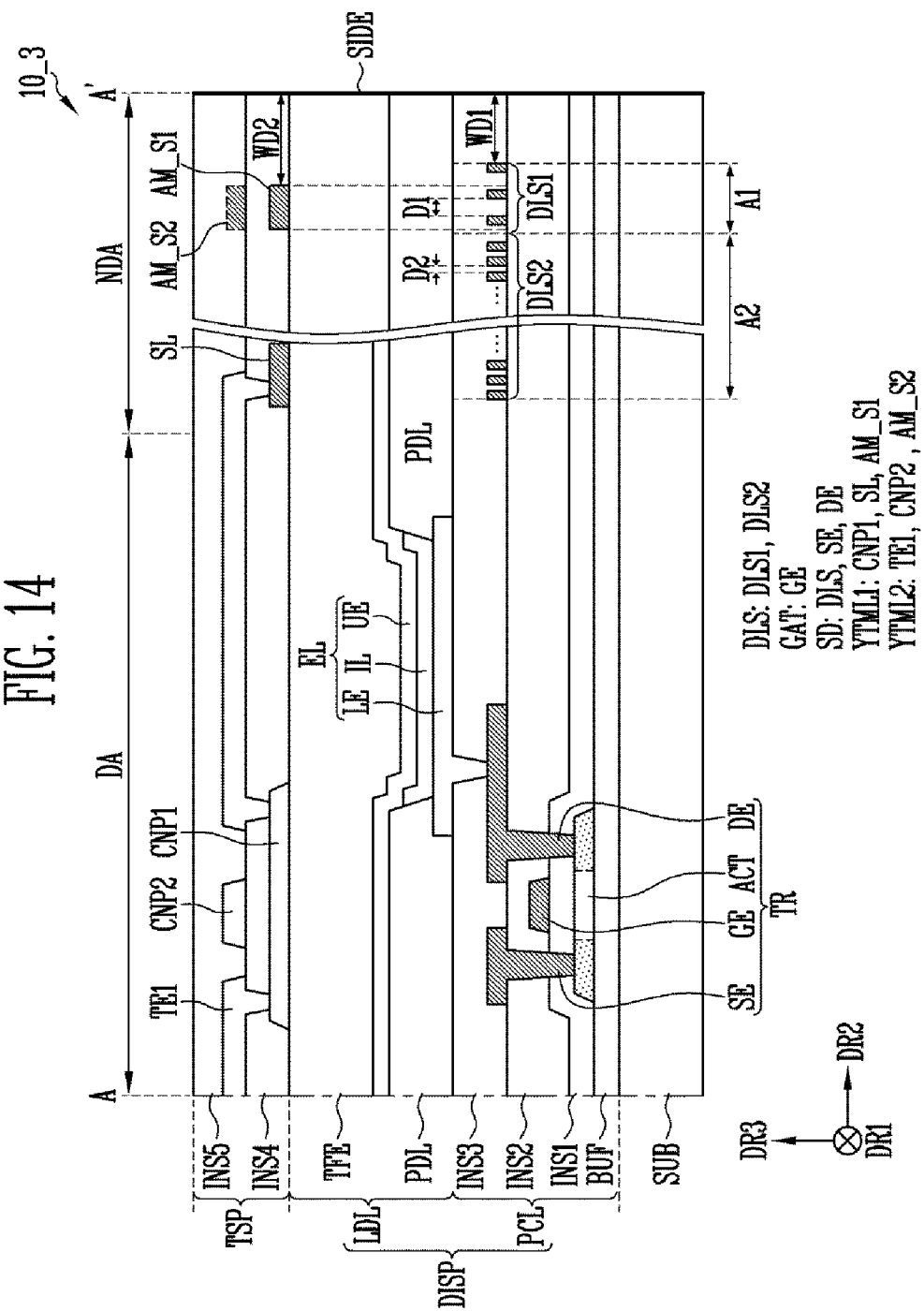

Referring to FIGS. 11 and 14, the display module 10_3 is different from the display module 10 of FIG. 11 in that the display module 10_3 includes a first sub-align mark AM_S1 and a second sub-align mark AM_S2.

The first sub-align mark AM_S1 and the second sub-align mark AM_S2 may be separated vertically from each other, and may be disposed on different layers. As illustrated in FIG. 14, the first sub-align mark AM_S1 may be formed in the same layer as the first connection pattern CNP1, and the second sub-align mark AM_S2 may be formed in the same layer as the first sensing electrode TE1.

In an embodiment, the first sub-align mark AM_S1 and the second sub-align mark AM_S2 may be included in a single align mark AM (e.g., a first align mark AM1) or may constitute a single align mark AM.

For example, the first sub-align mark AM_S1 may be the first align pattern AMP1 (or the third align pattern AMP3), described above with reference to FIG. 6, and the second sub-align mark AM_S2 may be the second align pattern AMP2.

In an example, the first sub-align mark AM_S1 and the second sub-align mark AM_S2 may overlap each other, and may constitute a single align pattern (e.g., the second align pattern AMP2 described with reference to FIG. 6). In this case, the shape of the align mark AM (e.g., a more complicated shape) may be more easily implemented.

Figure 15:
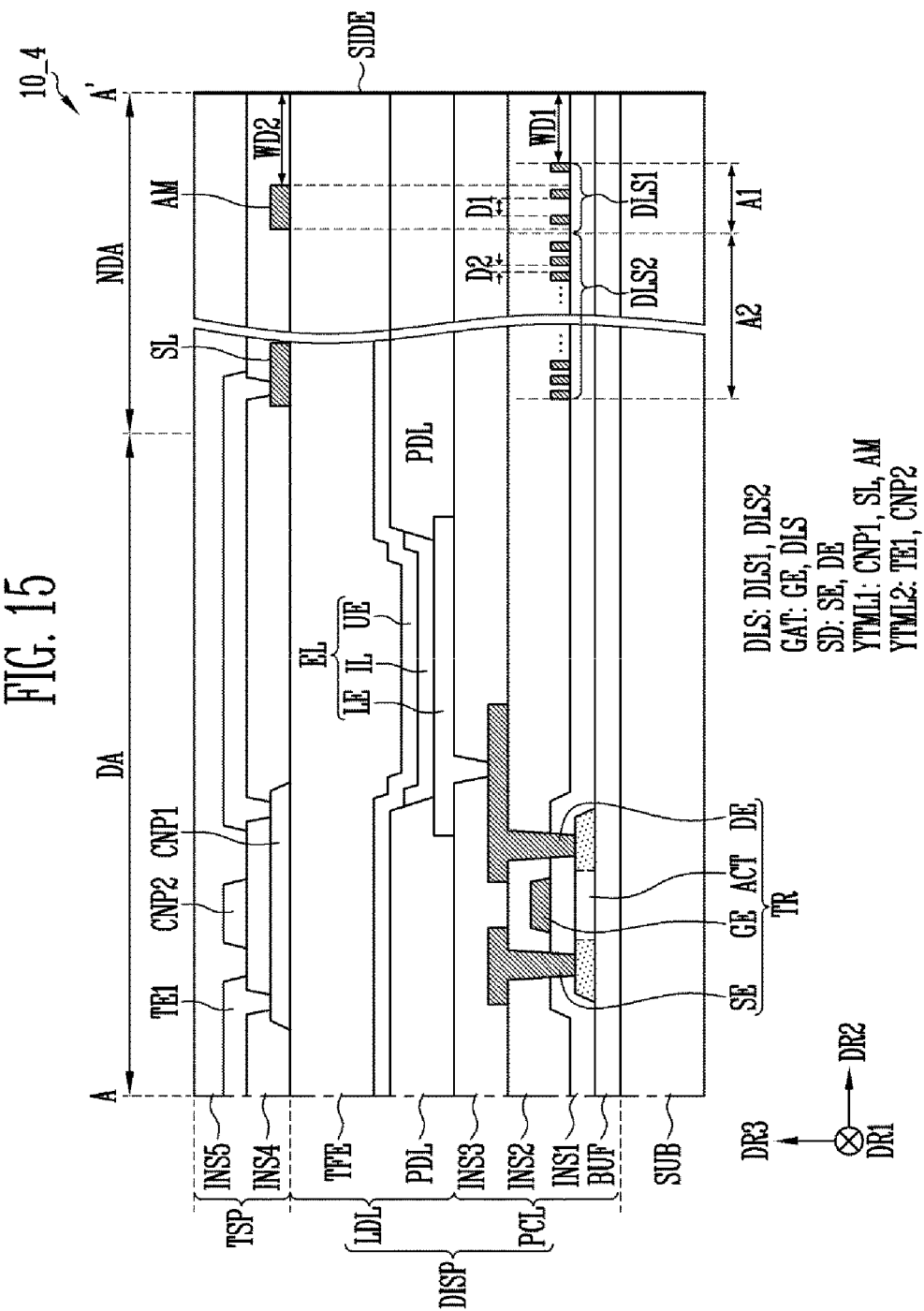

Referring to FIGS. 11 and 15, the display module 10_4 is different from the display module 10 of FIG. 11 in that the display module 10_4 includes lines DLS formed in the same layer as the gate electrode GE of the transistor TR (or the first conductive layer GAT).

The lines DLS of FIG. 15 are substantially identical or similar to the lines DLS described above with reference to FIG. 11, except for the layer on which the lines DLS are disposed, and thus repeated descriptions thereof will be omitted to avoid redundancy.

That is, the align mark AM may overlap some of lines DLS (i.e., first lines DLS1 disposed in the outermost portion in a plan view, among the lines DLS, e.g., first and second detection lines MCD1 and MCD2, described above with reference to FIG. 5), and some of the lines DLS may be disposed in the same layer as the gate electrode or source and drain electrode of the transistor TR. Further, when the display module 10_4 further includes an additional conductive layer different from the gate electrode or source and drain electrode of the transistor TR, the first lines DLS1 may be included in the additional conductive layer.

Figure 16:
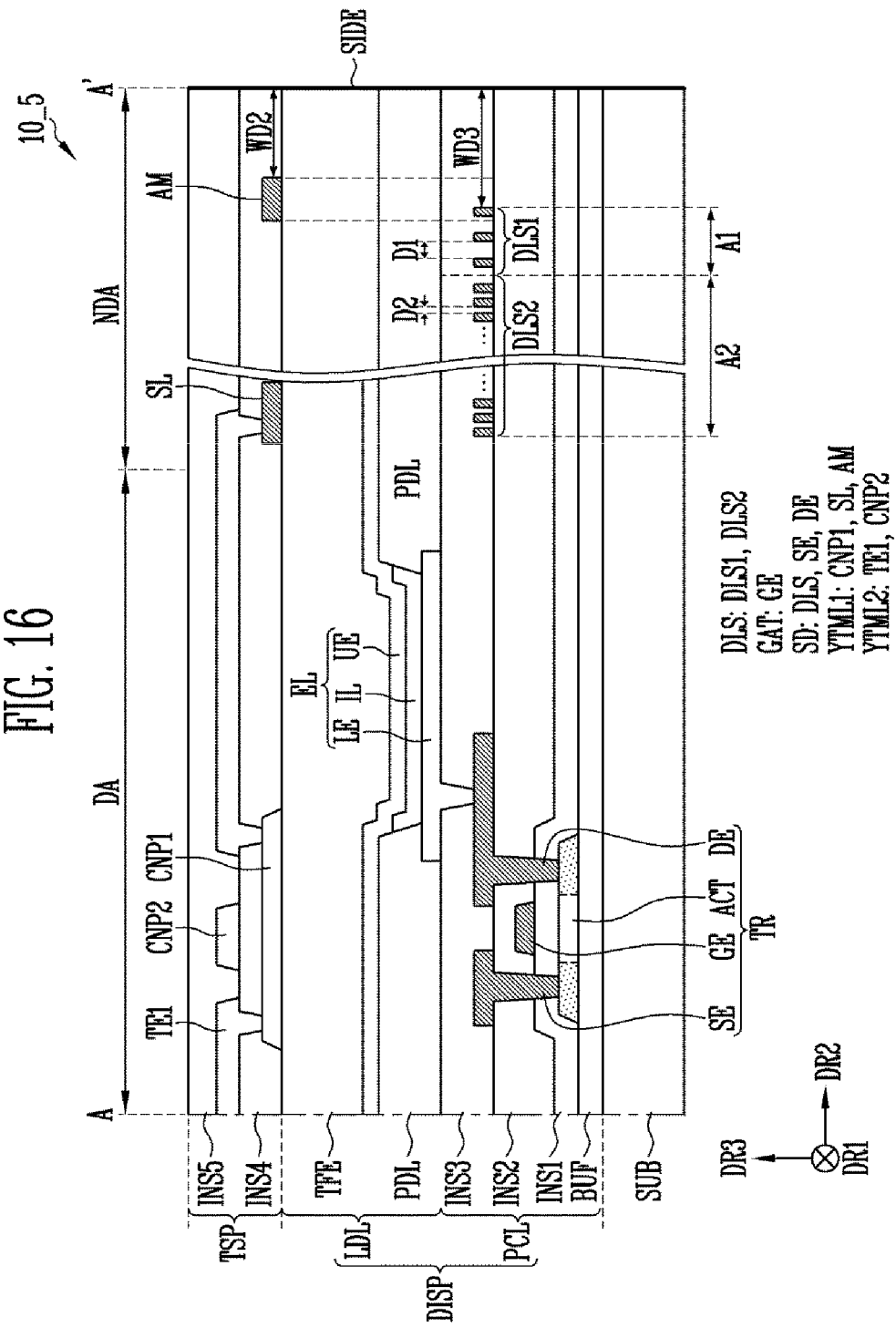
FIG. 16 is a cross-sectional view illustrating another exemplary embodiment of a display module taken along line A-A' of FIG. 2.

FIG. 16 is a cross-sectional view illustrating another exemplary embodiment of a display module taken along line A-A' of FIG. 2. In FIG. 16, a cross-sectional view of a display module 10_5 corresponding to FIG. 11 is illustrated.

Figure 17:
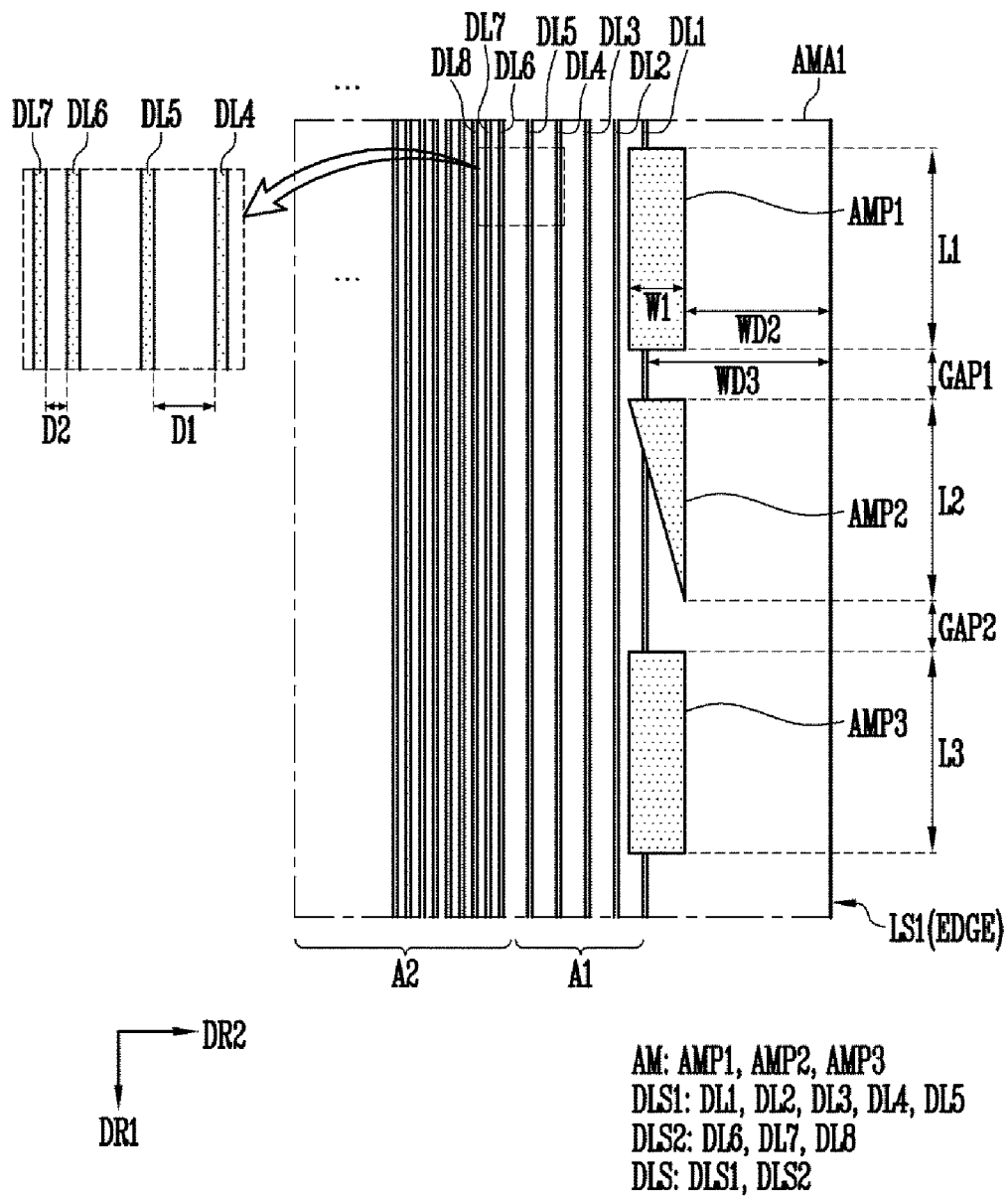
FIG. 17 is a plan view illustrating an exemplary embodiment of the display module of FIG. 16.

FIG. 17 is a plan view illustrating an exemplary embodiment of the display module of FIG. 16. In FIG. 17, a part of the display module 10_5 corresponding to the first detection region AMA1 of FIG. 6 is illustrated.

Referring to FIGS. 7, 11, 16, and 17, the display module 10_5 of FIG. 16 may be substantially identical or similar to the display module 10, described above with reference to FIGS. 7 and 11, except for that the arrangement location of the align mark AM. Thus, repeated descriptions thereof will be omitted to avoid redundancy.

The align mark AM may be disposed in the same layer as the first connection pattern CNP1 (or the third conductive layer YTML1), and may partially overlap the first lines DLS1 (or the first area A1 in which the first lines DLS1 are provided).

For example, when the first area A1 in which the first lines DLS1 are arranged is not sufficiently defined due to specifications or the like required by the lines DLS, for example, when the width of the first area A1 in the second direction DR2 is less than the first width W1 of the first align pattern AMP1, the align mark AM may partially overlap the lines DLS.

In this case, the third shortest distance WD3 from one of the lines DLS to the side surface SIDE of the display module 10_5 (or the edge of the display module) may be greater than the second shortest distance WD2 from the align mark AM to the side surface SIDE of the display module 10_5 (or the edge of the display module).

As illustrated in FIG. 17, the third shortest distance WD3 from the first line DL1 disposed in the outermost portion, among the lines DLS, to the first long side LS1 of the display module 10_5 (or the edge of the display module) may be greater than the second shortest distance WD2 from the align mark AM (or the first align pattern AMP1) to the first long side LS1 of the display module 10_5 (or the edge of the display module).

The align mark AM illustrated in FIGS. 16 and 17 is substantially identical or similar to the align mark AM described above with reference to FIGS. 7 and 11, except for the arrangement location of the align mark AM or the relationship of the arrangement between the align mark AM and the first lines DLS1, and thus repeated descriptions thereof will be omitted to avoid redundancy.

As described above with reference to FIGS. 16 and 17, the align mark AM may partially overlap the lines DLS (or first lines DLS1).

Figure 18:
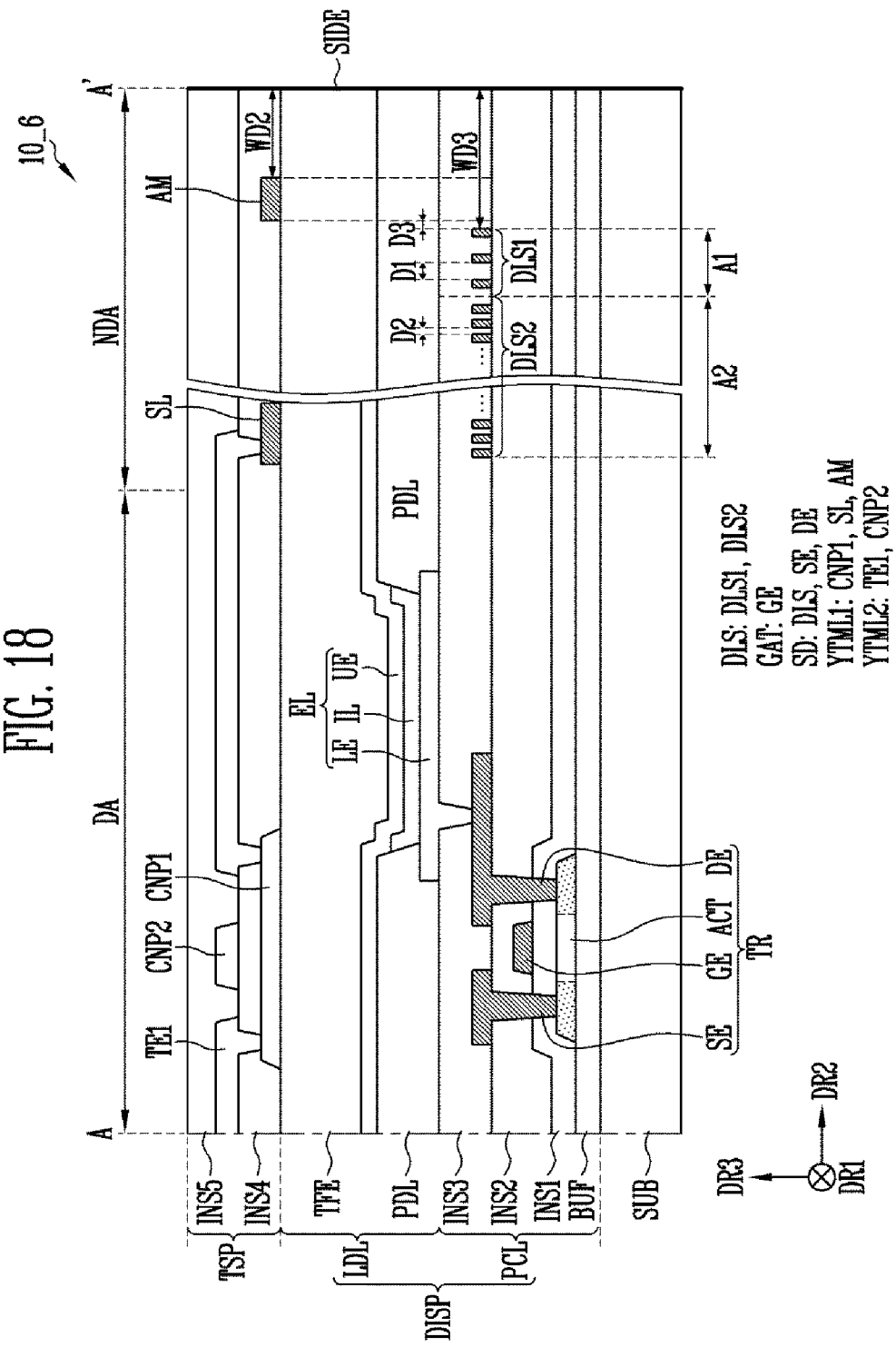
FIG. 18 is a cross-sectional view illustrating another exemplary embodiment of a display module taken along line A-A' of FIG. 2.
Figure 19:
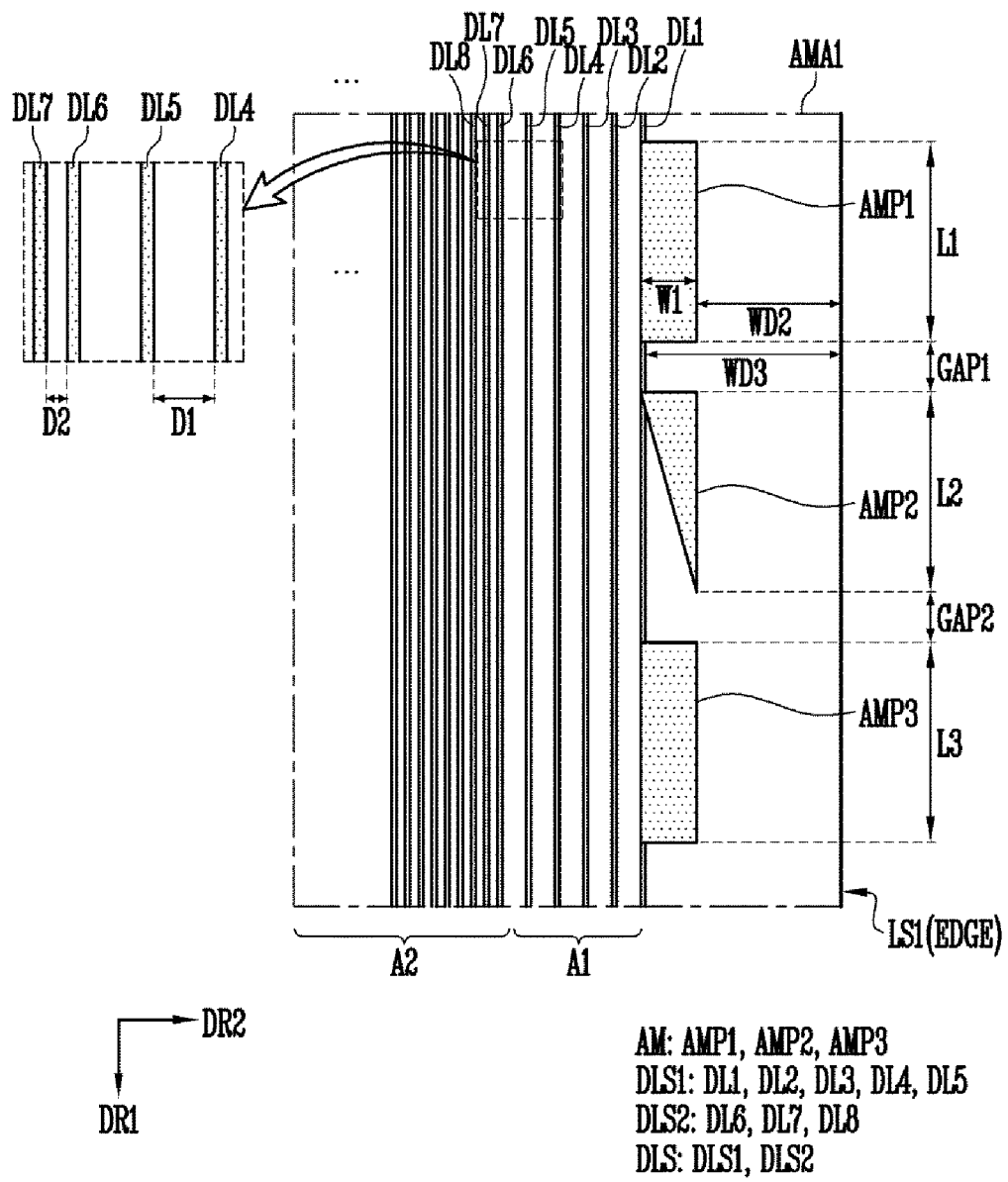
FIG. 19 is a plan view illustrating an exemplary embodiment of the display module of FIG. 18.

FIG. 18 is a cross-sectional view illustrating another exemplary embodiment of a display module taken along line A-A' of FIG. 2. In FIG. 18, a cross-sectional view of a display module 10_6 corresponding to FIG. 11 is illustrated, and not all elements depicted in FIG. 11 are described to avoid redundancy. FIG. 19 is a plan view illustrating an exemplary embodiment of the display module of FIG. 18. In FIG. 19, a part of the display module 10_6 corresponding to the first detection region AMA1 of FIG. 6 is illustrated.

Referring to FIGS. 7, 11, 18, and 19, the display module 10_6 of FIG. 18 is different from the display module 10 described above with reference to FIGS. 7 and 11, in that the align mark AM does not overlap the lines DLS.

The align mark AM may be disposed in the same layer as the first connection pattern CNP1 (or the third conductive layer YTML1), and may not overlap the first lines DLS1 (or the first area A1 in which the first lines DLS1 are provided).

For example, when it is impossible to define the first area A1 in which the first lines DLS1 are arranged due to required specifications of the lines DLS, the align mark AM may not overlap the lines DLS.

In this case, the third shortest distance WD3 from one of the lines DLS to the side surface of the display module 10_6 (or the edge of the display module) may be greater than the second shortest distance WD2 from the align mark AM to the side surface of the display module 10_6 (or the edge of the display module).

In an embodiment, in a plan view (or in a horizontal direction), a third interval D3 between the align mark AM and the lines DLS may be less than a first interval D1 (or a second interval D2) between the lines DLS.

For example, as illustrated in FIG. 18, the third interval D3 between the align mark AM and the lines DLS in a horizontal direction may be less than the first interval D1 between the first lines DLS. Further, the third interval D3 may be greater than the second interval D2. The reason for this is that, as described above with reference to FIG. 9, the second interval D2 may not be identified depending on the resolution of the vision cameras VCM of FIG. 8, and that, when the align mark AM is spaced apart from the lines DLS by an interval less than the second interval D2, the align mark AM may not be identified from the lines DLS. Therefore, the third interval D3 may also be greater than the second interval D2.

In an embodiment, as illustrated in FIG. 19, in a plan view, the align mark AM and the lines DLS may actually be in contact with each other, and in this case, the third interval D3, as depicted in FIG. 18, may substantially be, for example, 0. A portion in which the align mark AM come into contact with the lines DLS may be set to a feature point. Alternatively, an entire planar shape (or an image corresponding to the entire planar shape, e.g., a generally "|=" shape) of the lines DLS in the first detection region AMA1 and align patterns AMP1, AMP2, and AMP3 protruding from the lines DLS in the second direction DR2 may be set to the align mark AM. Therefore, even if the align mark AM and the lines DLS are recognized as a single shape without being individually distinguished from each other, the align patterns AWL AMP2, and AMP3 may function as the align mark AM.

As described above with reference to FIGS. 18 and 19, the align mark AM may not overlap the lines DLS, but may be arranged to be as close to the lines DSL as possible or to be in contact with the lines DLS in the plan view.

Figure 20:
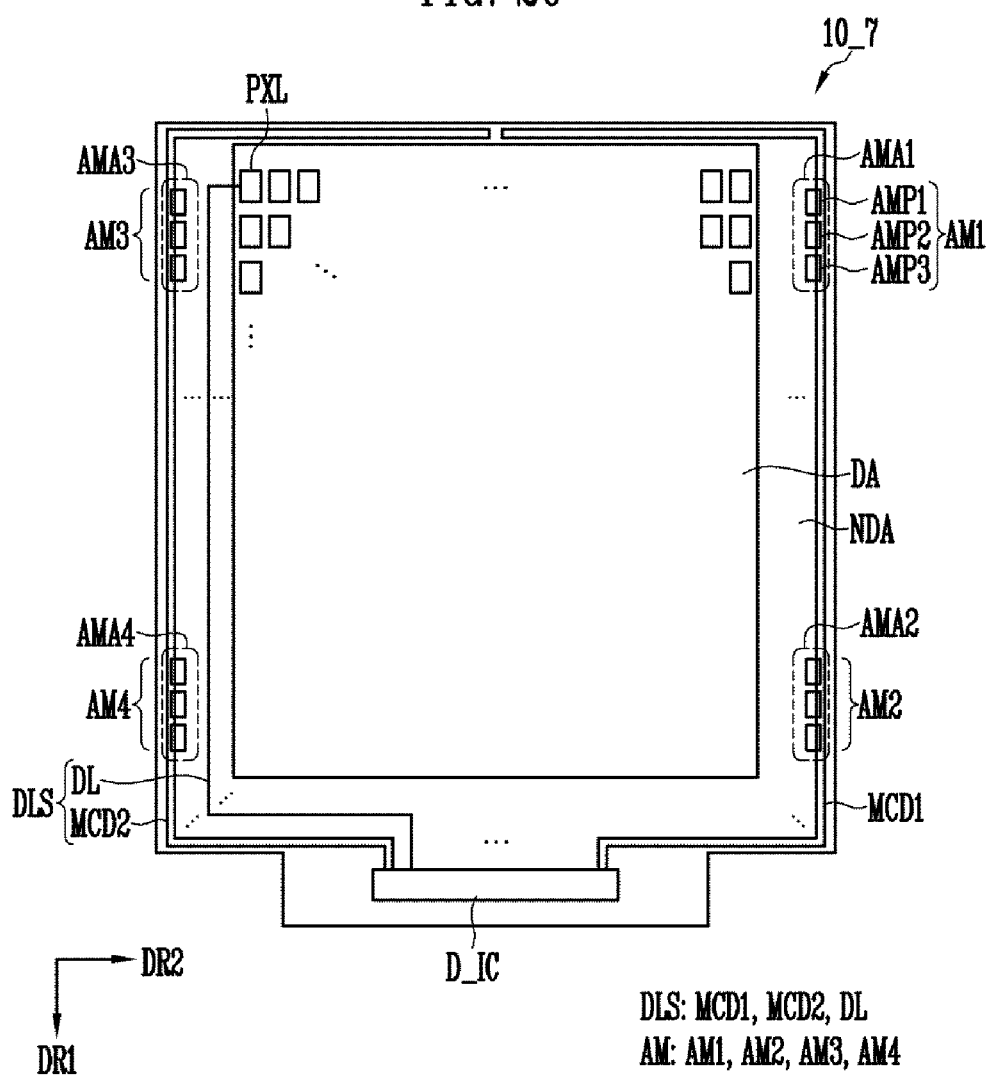
FIG. 20 is a plan view illustrating another exemplary embodiment of a display module included in the display device of FIG. 2.

FIG. 20 is a plan view illustrating another embodiment of a display module included in the display device of FIG. 2. In FIG. 20, a display module 10_7 corresponding to the display unit DISP of FIG. 5 is illustrated.

Referring to FIGS. 2, 5, and 20, the display module 10_7 of FIG. 20 (or display unit) is different from the display unit DISP of FIG. 5 in that the display module 10_7 further includes an align mark AM.

The align mark AM may be provided in a non-display area NDA, and may overlap some of lines DLS. Since the align mark AM (and align patterns AWL AMP2, and AMP3) are substantially identical or similar to the align mark AM (and align patterns AMP1, AMP2, and AMP3) described above with reference to FIGS. 3, 5, 6, 7, and 10, repeated descriptions thereof will be omitted to avoid redundancy.

Figure 21:
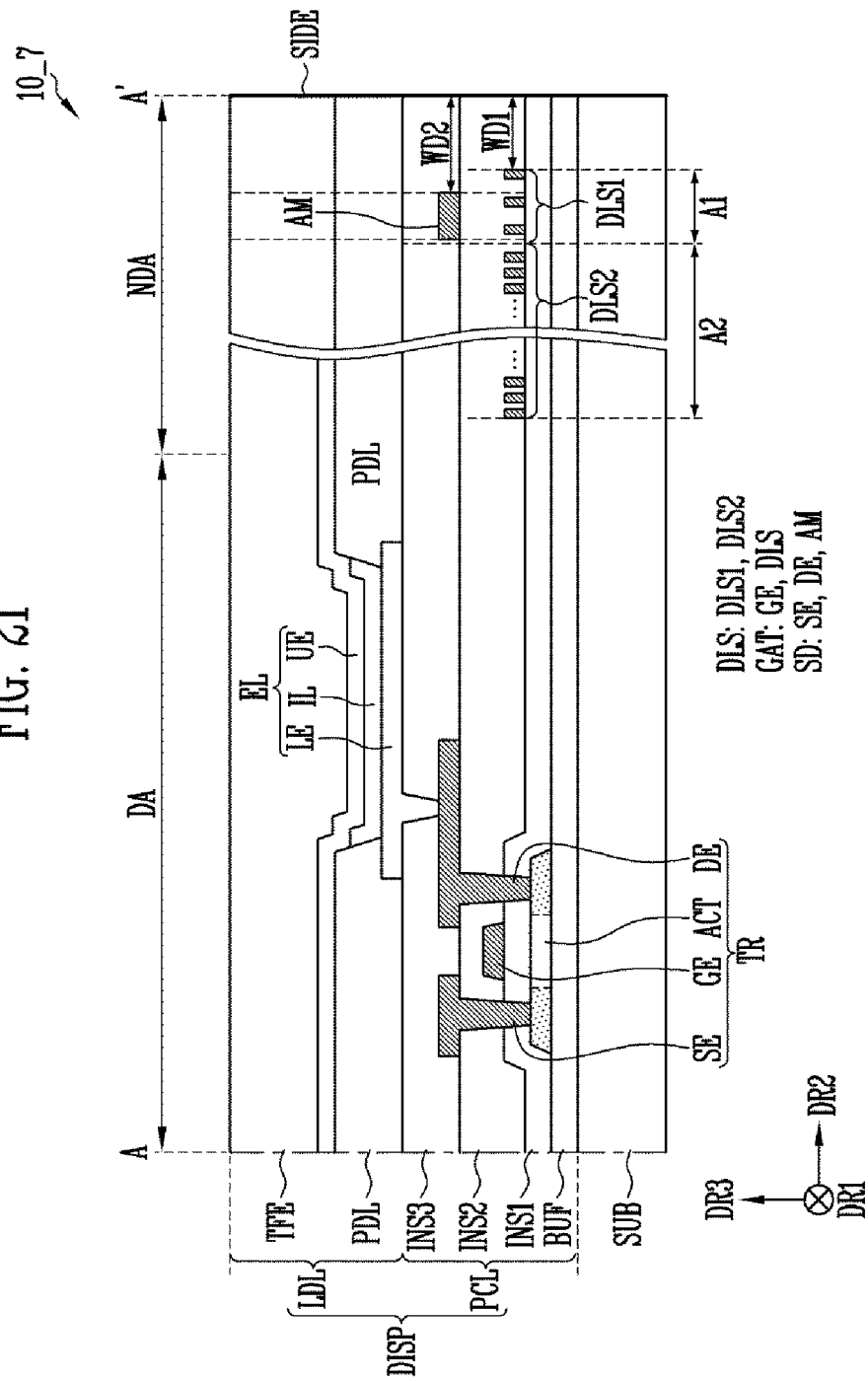
FIG. 21 is a cross-sectional view illustrating an exemplary embodiment of the display module of FIG. 20.

FIG. 21 is a cross-sectional view illustrating an exemplary embodiment of the display module of FIG. 20. In FIG. 21, the section of the display module 10_7 corresponding to the display module 10 of FIG. 11 is illustrated. Referring to FIGS. 11, 20, and 21, the display module 10_7 is different from the display module 10 of FIG. 11 in that the display module 10_7 does not include a sensing unit TSP.

The display module 10_7 may include a base substrate SUB (or a pixel circuit PCL), lines DLS, an align mark AM, and a light-emitting element EL (or a light-emitting unit LDL). Since the base substrate SUB, lines DLS, and a light-emitting element EL are substantially identical or similar to the base substrate SUB, lines DLS, and a light-emitting element EL described above with reference to FIG. 11 (or FIG. 15), except for the align mark AM, repeated descriptions thereof will be omitted to avoid redundancy.

The lines DLS may be disposed in the same layer as the gate electrode GE of the transistor TR, and the align mark AM may be disposed in the same layer as the source and drain electrodes SE and DE of the transistor TR.

The align mark AM may overlap some of lines DLS (i.e., first lines DLS1 disposed in the outermost portion in a plan view, among the lines DLS, e.g., first and second detection lines MCD1 and MCD2, described above with reference to FIG. 5).

The first shortest distance WD1 from one of the lines DLS to the side surface SIDE of the display module 10_7 may be less than or equal to the second shortest distance WD2 from the align mark AM to the side surface SIDE of the display module 10_7. In this case, through vision cameras VCM (see FIG. 8), an image of the display module 10_7 substantially identical to the image IMAGE1, described above with reference to FIG. 9, may be acquired.

Although the align mark AM and the first lines DSL1 are described as overlapping each other, the exemplary embodiments are not limited thereto. For example, as described above with reference to FIGS. 16 and 18, the align mark AM may be arranged to partially overlap the first lines DSL1 (or the first area A1) or arranged adjacent to the first lines DSL1 (or the first area A1). In this case, similar to the third shortest distance WD3 (see FIG. 16 or 18), the first shortest distance WD1 may be greater than the second shortest distance WD2.

Further, although the align mark AM is illustrated as being disposed on the top of the first lines DSL1 in FIG. 21, the align mark AM is not limited thereto.

Figure 22:
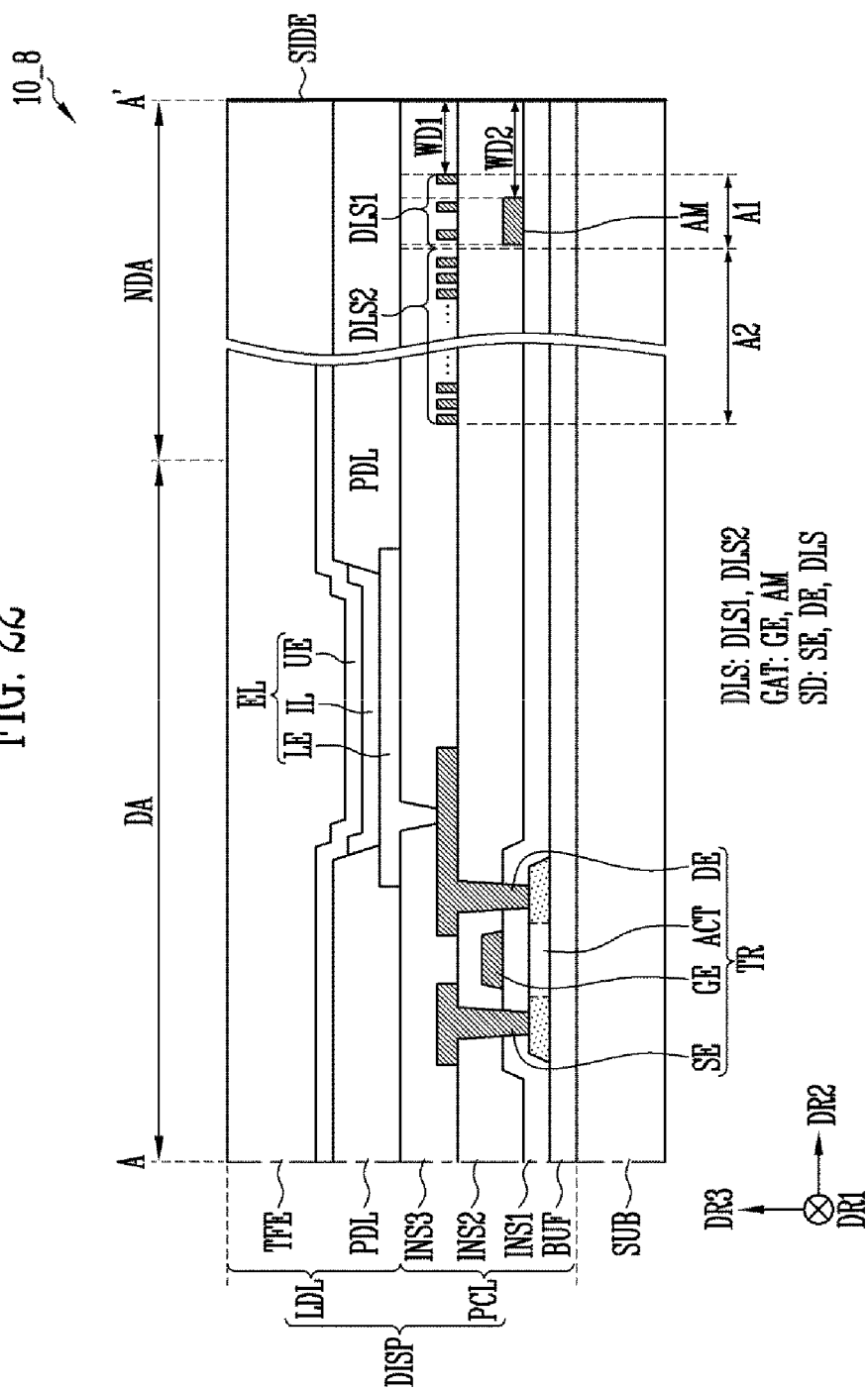
FIG. 22 is a cross-sectional view illustrating an exemplary embodiment of the display module of FIG. 20.

FIG. 22 is a cross-sectional view illustrating an exemplary embodiment of the display module of FIG. 20. In FIG. 22, a display module 10_8 corresponding to the display module 10_7 of FIG. 21 is illustrated.

Referring to FIGS. 20 to 22, the display module 10_8 may be substantially identical or similar to the display module 10_7 of FIG. 21, except for the arrangement locations of lines DLS and the align mark AM. Thus, repeated descriptions thereof will be omitted to avoid redundancy.

The align mark AM may be disposed in the same layer as the gate electrode GE of the transistor TR, and the lines DLS may be disposed in the same layer as the source and drain electrodes SE and DE of the transistor TR. That is, the align mark AM may be disposed below the lines DLS (or below the first lines DSL1).

As described above with reference to FIGS. 20 to 22, the align mark AM may be disposed on a layer differing from the layer on which some of the lines DLS (e.g., the first lines DSL1 or the outermost line) are disposed, and the align mark AM may overlap some of the lines DLS.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a base substrate including a display area and a non-display area positioned at a side of the display area;
   at least one transistor in the display area of the base substrate and conductive lines in the non-display area of the base substrate;
   at least one light-emitting element in the display area that is coupled to the at least one transistor;
   an encapsulation layer covering the light-emitting element;
   a sensing electrode on the encapsulation layer and a sensing line on the encapsulation layer coupled to the sensing electrode; and
   an align mark on the encapsulation layer,
   wherein:
   the align mark overlaps at least one of the conductive lines in the non-display area, in a plan view;
   the at least one of the conductive lines is provided on a first area of the base substrate, and the remaining ones of the conductive lines are provided on a second area of the base substrate, and
   a transmittance at the first area is higher than a transmittance at the second area.

2. The display device according to claim 1, wherein a pitch between the at least one of the conductive lines is greater than the pitch between the remaining conductive lines.

3. The display device according to claim 1, a shortest distance from one of the conductive lines to an edge of the base substrate is less than a shortest distance from the align mark to the edge of the base substrate, in a plan view.

4. The display device according to claim 1, wherein:
   the align mark comprises align patterns, and
   the align patterns are spaced apart from each other, and adjacent align patterns have different planar shapes.

5. The display device according to claim 4, wherein:
   the align mark comprises a first align pattern, a second align pattern, and a third align pattern that are sequentially arranged, and
   the first align pattern and the third align pattern have a substantially identical planar shape.

6. The display device according to claim 1, wherein:
   the at least one of the conductive lines includes a crack detection line extending along an edge of the display area, and
   the crack detection line is electrically isolated from the at least one transistor.

7. The display device according to claim 1, wherein:
   a side surface of the display device forms an acute angle with a line generally parallel to a thickness direction of the base substrate.

8. The display device according to claim 7, wherein the at least one transistor comprises:
   a semiconductor pattern disposed on the base substrate;
   a gate electrode on the semiconductor pattern overlapping the semiconductor pattern;
   a first insulating layer disposed on the gate electrode; and
   a source electrode and a drain electrode on the first insulating layer.

9. The display device according to claim 8, wherein the at least one of the conductive lines is disposed on a same layer as the gate electrode.

10. The display device according to claim 8, wherein the at least one of the conductive lines is disposed on a same layer as the source electrode and the drain electrode.

11. The display device according to claim 1, wherein:
    the align mark comprises sub-align marks, and
    the sub-align marks are separated from each other and disposed in different layers.

12. The display device according to claim 1, wherein the align mark partially overlaps the some of the conductive lines, and the align mark is closer to an edge of the base substrate than the conductive lines.

13. The display device according to claim 1, wherein the align mark is formed directly on the encapsulation layer.

14. The display device according to claim 1, further comprising a connection pattern to couple the sensing electrode to an adjacent sensing electrode,
    wherein the connection pattern and the align mark are formed on a same layer.

15. The display device according to claim 14, wherein the connection pattern and the align mark include a same material.

16. The display device according to claim 14, wherein the connection pattern and the align mark are simultaneously formed through a same process.

17. The display device according to claim 1, wherein the sensing electrode and the align mark are formed on a same layer.

18. The display device according to claim 1, wherein the sensing electrode and the align mark include a same material.

19. The display device according to claim 1, wherein the sensing electrode and the align mark are simultaneously formed through a same process.

20. A display device, comprising:
- a base substrate including a display area and a non-display area positioned at a side of the display area;
- at least one transistor in the display area of the base substrate and conductive lines in the non-display area of the base substrate;
- at least one light-emitting element in the display area that is coupled to the at least one transistor;
- an encapsulation layer covering the light-emitting element;
- a sensing electrode on the encapsulation layer and a sensing line on the encapsulation layer coupled to the sensing electrode; and
- an align mark on the encapsulation layer, wherein:
- the align mark overlaps at least one of the conductive lines in the non-display area, in a plan view;
- the align mark comprises align patterns;
- the align patterns are spaced apart from each other, and adjacent align patterns have different planar shapes;
- the align patterns are sequentially arranged along a first direction;
- a length of each of the align patterns in the first direction is greater than a width of each of the align patterns in a second direction;
- the second direction is generally perpendicular to the first direction; and
- a pitch between the align patterns is less than the length in the first direction.

21. The display device according to claim 20, wherein:
the length in the first direction is within a range from about 100 μm to about 500 μm, and
the width in the second direction is within a range from about 30 μm to about 150 μm.

22. The display device according to claim 20, wherein the length in the first direction is about three to six times as large as the width in the second direction.

23. The display device according to claim 20, wherein:
one of the align patterns has a generally rectangular planar shape, and
another of the align patterns has a generally triangular planar shape.

* * * * *